United States Patent
Ozaki et al.

(10) Patent No.: US 7,592,626 B2
(45) Date of Patent: Sep. 22, 2009

(54) CAPACITOR AND METHOD OF MANUFACTURING SAME

(75) Inventors: Yumiko Ozaki, Tokyo (JP); Osamu Shinoura, Tokyo (JP)

(73) Assignee: TDK Corporation, Tokyo (JP)

( * ) Notice: Subject to any disclaimer, the term of this patent is extended or adjusted under 35 U.S.C. 154(b) by 207 days.

(21) Appl. No.: 11/635,000

(22) Filed: Dec. 7, 2006

(65) Prior Publication Data

US 2007/0131935 A1    Jun. 14, 2007

(30) Foreign Application Priority Data

Dec. 12, 2005  (JP)  .............................. 2005-357367
Nov. 20, 2006  (JP)  .............................. 2006-313100

(51) Int. Cl.
*H01L 27/108*    (2006.01)

(52) U.S. Cl. ........................... 257/68; 257/71; 257/296; 257/306; 257/309; 257/532; 257/E21.008; 257/E21.009

(58) Field of Classification Search .................... 257/68, 257/71, 296, 306, 309, 532, E21.008, E21.009
See application file for complete search history.

(56) References Cited

U.S. PATENT DOCUMENTS

| | | | |
|---|---|---|---|
| 4,464,823 A | | 8/1984 | Izu et al. |
| 5,587,614 A | * | 12/1996 | Hwang et al. ................ 257/532 |
| 5,854,499 A | | 12/1998 | Nishioka |
| 5,923,062 A | * | 7/1999 | Ohno ........................... 257/298 |
| 5,936,257 A | * | 8/1999 | Kusunoki et al. .............. 257/10 |
| 6,132,585 A | | 10/2000 | Midorikawa et al. |
| 6,166,424 A | * | 12/2000 | Mikawa et al. ................ 257/535 |
| 6,207,522 B1 | | 3/2001 | Hunt et al. |
| 6,270,835 B1 | | 8/2001 | Hunt et al. |
| 6,433,993 B1 | | 8/2002 | Hunt et al. |

FOREIGN PATENT DOCUMENTS

| | | |
|---|---|---|
| JP | A 60-46080 | 3/1985 |
| JP | A 61-64112 | 4/1986 |
| JP | A 6-21493 | 1/1994 |
| JP | A 6-112081 | 4/1994 |
| JP | A 8-31951 | 2/1996 |
| JP | A 8-78283 | 3/1996 |
| JP | A 2000-164460 | 6/2000 |
| JP | A 2001-356367 | 12/2001 |
| JP | A 2002-26266 | 1/2002 |

* cited by examiner

*Primary Examiner*—Andy Huynh
(74) *Attorney, Agent, or Firm*—Oliff & Berridge, PLC

(57) ABSTRACT

A capacitor comprises: a lower electrode formed of a foil made of a polycrystalline metal; an upper conductor layer; and a dielectric layer disposed between the lower electrode and the upper electrode layer. Grain boundaries of the polycrystalline metal appear at the top surface of the lower electrode. The capacitor further comprises an insulator that is disposed between the top surface of the dielectric layer and the bottom surface of the upper electrode layer and that is present only in part of a region in which the top surface of the dielectric layer and the bottom surface of the upper electrode layer face each other. The insulator is disposed to cover at least part of the grain boundaries appearing at the top surface of the lower electrode when seen from above the top surface of the dielectric layer. The insulator is formed by electrophoresis.

10 Claims, 8 Drawing Sheets

CAPACITOR AND METHOD OF MANUFACTURING SAME

BACKGROUND OF THE INVENTION

1. Field of the Invention

The present invention relates to a capacitor comprising a lower electrode, an upper electrode layer, and a dielectric layer disposed between the lower electrode and the upper electrode layer, and to a method of manufacturing such a capacitor.

2. Description of the Related Art

With increasing demands for reductions in dimensions and thickness of high frequency electronic apparatuses such as cellular phones, reductions in dimensions and height of electronic components mounted on the high frequency electronic apparatuses have been sought. One of the electronic components is a capacitor. The capacitor typically incorporates a dielectric layer and a pair of electrode layers disposed to sandwich the dielectric layer.

To achieve reductions in dimensions and height of a capacitor, important factors are a reduction in area of a region in which the pair of electrode layers are opposed to each other with the dielectric layer disposed in between and a reduction in the number of layers making up the capacitor. To achieve these, it is effective to reduce the thickness of the dielectric layer. A capacitor incorporating a dielectric layer formed through thin-film forming techniques such as sputtering (such a capacitor may be hereinafter called a thin-film capacitor), as disclosed in Japanese Published Patent Application 2002-26266, for example, is known as being capable of achieving a reduction in thickness of the dielectric layer. The capacitor disclosed in this publication is formed by stacking a first electrode layer, a dielectric layer and a second electrode layer in this order on a base substrate.

As disclosed in this publication, conventional thin-film capacitors have a problem that, if the thickness of the dielectric layer is reduced, leakage current of the dielectric layer is increased and/or the withstand voltage of the dielectric layer is reduced. It is assumed that this problem results from pinholes and crystal grain boundaries existing in the dielectric layer, as disclosed in the above-mentioned publication.

To solve this problem, the above-mentioned publication discloses a technique in which an insulator formed by oxidizing the material of the first electrode layer is provided in part between the first electrode layer and pinholes or grain boundaries of the dielectric layer.

The inventors of the present patent application conceived a method of manufacturing a thin-film capacitor by stacking a dielectric layer and an upper electrode layer one by one through thin-film forming techniques on a metallic foil that functions as both of a substrate and a lower electrode. According to this technique, it is possible to mass-produce thin-film capacitors at lower costs, compared with the case of manufacturing a thin-film capacitor by stacking a lower electrode layer, a dielectric layer and an upper electrode layer one by one on a substrate through thin-film forming techniques.

However, in the thin-film capacitors manufactured by stacking the dielectric layer and the upper electrode layer on the metallic foil through thin-film forming techniques as described above, a short-circuit failure and/or an increase in leakage current of the dielectric layer has been found to occur in some cases even if the dielectric layer has no defect. Such a phenomenon has not been experienced in thin-film capacitors manufactured by stacking a lower electrode layer, a dielectric layer and an upper electrode layer on a substrate through thin-film forming techniques.

As disclosed in Japanese Published Patent Application 2002-26266, it is known that an increase in leakage current of the dielectric layer and a reduction in withstand voltage of the dielectric layer can occur due to defects existing in the dielectric layer. However, there has been no recognition that a short-circuit failure and/or an increase in leakage current of the dielectric layer can occur even if the dielectric layer has no defect.

In a case in which an insulator is provided on or below a part of the dielectric layer in a thin-film capacitor to prevent the occurrence of short-circuit failure and an increase in leakage current of the dielectric layer, if the insulator is too large, the characteristics of the capacitor may be degraded due to the existence of the insulator.

OBJECT AND SUMMARY OF THE INVENTION

It is a first object of the invention to provide a capacitor comprising a lower electrode made of a foil, an upper electrode layer, and a dielectric layer disposed between the lower electrode and the upper electrode layer, the capacitor being capable of preventing an increase in leakage current of the dielectric layer and an occurrence of short-circuit failure that are not caused by defects of the dielectric layer, and to provide a method of manufacturing such a capacitor.

It is a second object of the invention to provide a method of manufacturing a capacitor comprising a lower electrode, an upper electrode layer, and a dielectric layer disposed between the lower electrode and the upper electrode layer, the method being capable of preventing an increase in leakage current of the dielectric layer and an occurrence of short-circuit failure while suppressing degradation of characteristics of the capacitor.

A capacitor of the invention comprises: a lower electrode formed of a foil made of a polycrystalline metal; an upper electrode layer; and a dielectric layer disposed between the lower electrode and the upper electrode layer. The lower electrode has a top surface facing the dielectric layer, and has grain boundaries of the polycrystalline metal appearing at the top surface. The upper electrode layer has a bottom surface facing the dielectric layer. The dielectric layer has a bottom surface facing the top surface of the lower electrode, and a top surface facing the bottom surface of the upper electrode layer. The capacitor further comprises a resin insulator that is disposed between the top surface of the dielectric layer and the bottom surface of the upper electrode layer and that is present only in part of a region in which the top surface of the dielectric layer and the bottom surface of the upper electrode layer face each other. The resin insulator is disposed to cover at least part of the grain boundaries appearing at the top surface of the lower electrode when seen from above the top surface of the dielectric layer.

A first method of manufacturing a capacitor of the invention is a method of manufacturing the above-described capacitor of the invention. The method comprises the steps of: forming the dielectric layer on the top surface of the lower electrode; forming the resin insulator on the top surface of the dielectric layer by electrophoresis; and forming the upper electrode layer.

According to the capacitor or the first method of manufacturing a capacitor of the invention, the resin insulator is disposed between the top surface of the dielectric layer and the bottom surface of the upper electrode layer and is present only in part of the region in which the top surface of the dielectric layer and the bottom surface of the upper electrode layer face each other. The resin insulator is disposed to cover at least part of the grain boundaries appearing at the top surface of the lower electrode when seen from above the top surface of the dielectric layer.

In the capacitor or the first method of the invention, for reasons of the production process, the polycrystalline metal may contain impurities besides main metallic elements making up the polycrystalline metal, and the polycrystalline metal may exhibit grain boundary segregation wherein the concentration of the impurities is higher at the grain boundaries than in crystal grains. In this case, the polycrystalline metal may have an impurities content of 30 to 6000 ppm inclusive. The presence or absence of grain boundary segregation can be observed with an electron microscope after performing cross section processing using focused ion beams, for example, and can be further confirmed by a technique such as local composition analysis of the cross section using an energy-dispersive X-ray analyzer, for example.

In the first method of the invention, in the step of forming the resin insulator, a step of forming by electrophoresis an electro-deposit that will be part of the resin insulator later and a step of increasing the electrical resistance of the electro-deposit may be alternately repeated a plurality of times. In this case, the step of increasing the electrical resistance of the electro-deposit may include a step of drying the electro-deposit. Alternatively, the step of increasing the electrical resistance of the electro-deposit may include a step of drying the electro-deposit and a step of curing the dried electro-deposit by heating. When the step of forming the electro-deposit is repeated a plurality of times, a voltage applied for electrophoresis may be made higher at a later one of the plurality of times than at an earlier one of the plurality of times.

A second method of manufacturing a capacitor of the invention is a method of manufacturing a capacitor comprising a lower electrode, an upper electrode layer, a dielectric layer having a defect and disposed between the lower electrode and the upper electrode layer, and a resin insulator for repairing the defect of the dielectric layer.

The second method of the invention comprises the steps of: forming the dielectric layer on the lower electrode; forming the resin insulator by electrophoresis after the dielectric layer is formed; and forming the upper electrode layer after the resin insulator is formed. In the step of forming the resin insulator, a step of forming by electrophoresis an electro-deposit that will be part of the resin insulator later and a step of increasing the electrical resistance of the electro-deposit are alternately repeated a plurality of times.

In the second method of the invention, the step of increasing the electrical resistance of the electro-deposit may include a step of drying the electro-deposit. Alternatively, the step of increasing the electrical resistance of the electro-deposit may include a step of drying the electro-deposit and a step of curing the dried electro-deposit by heating. When the step of forming the electro-deposit is repeated a plurality of times, a voltage applied for electrophoresis may be made higher at a later one of the plurality of times than at an earlier one of the plurality of times. The lower electrode may be formed of a foil made of a polycrystalline metal.

A third method of manufacturing a capacitor of the invention is a method of manufacturing a capacitor comprising a lower electrode formed of a foil made of a polycrystalline metal, an upper electrode layer, a dielectric layer having a defect and disposed between the lower electrode and the upper electrode layer, and a resin insulator for repairing the defect of the dielectric layer. The method comprises the steps of: forming the dielectric layer on the lower electrode; forming the resin insulator by electrophoresis after the dielectric layer is formed; and forming the upper electrode layer after the resin insulator is formed.

According to the capacitor or the first method of manufacturing the capacitor of the invention, the resin insulator is disposed between the top surface of the dielectric layer and the bottom surface of the upper electrode layer and is present only in part of the region in which the top surface of the dielectric layer and the bottom surface of the upper electrode layer face each other. The resin insulator is disposed to cover at least part of the grain boundaries appearing at the top surface of the lower electrode when seen from above the top surface of the dielectric layer. As a result, according to the invention, it is possible to prevent an increase in leakage current of the dielectric layer and an occurrence of short-circuit failure that are caused by the grain boundaries appearing at the top surface of the lower electrode.

According to the second method of manufacturing a capacitor of the invention, in the step of forming the resin insulator for repairing the defect of the dielectric layer, a step of forming by electrophoresis an electro-deposit that will be part of the resin insulator later and a step of increasing the electrical resistance of the electro-deposit are alternately repeated a plurality of times. As a result, according to the invention, it is possible to form the resin insulator in a small thickness and to thereby prevent an increase in leakage current of the dielectric layer and an occurrence of short-circuit failure while suppressing degradation of characteristics of the capacitor.

According to the third method of manufacturing a capacitor of the invention, it is possible not only to prevent an increase in leakage current of the dielectric layer and an occurrence of short-circuit failure that result from defects of the dielectric layer but also to prevent an increase in leakage current and an occurrence of short-circuit failure of the dielectric layer that result from the lower electrode formed of a foil made of a polycrystalline metal.

Other and further objects, features and advantages of the invention will appear more fully from the following description.

DETAILED DESCRIPTION OF PREFERRED EMBODIMENTS

First Embodiment

Figure 1:
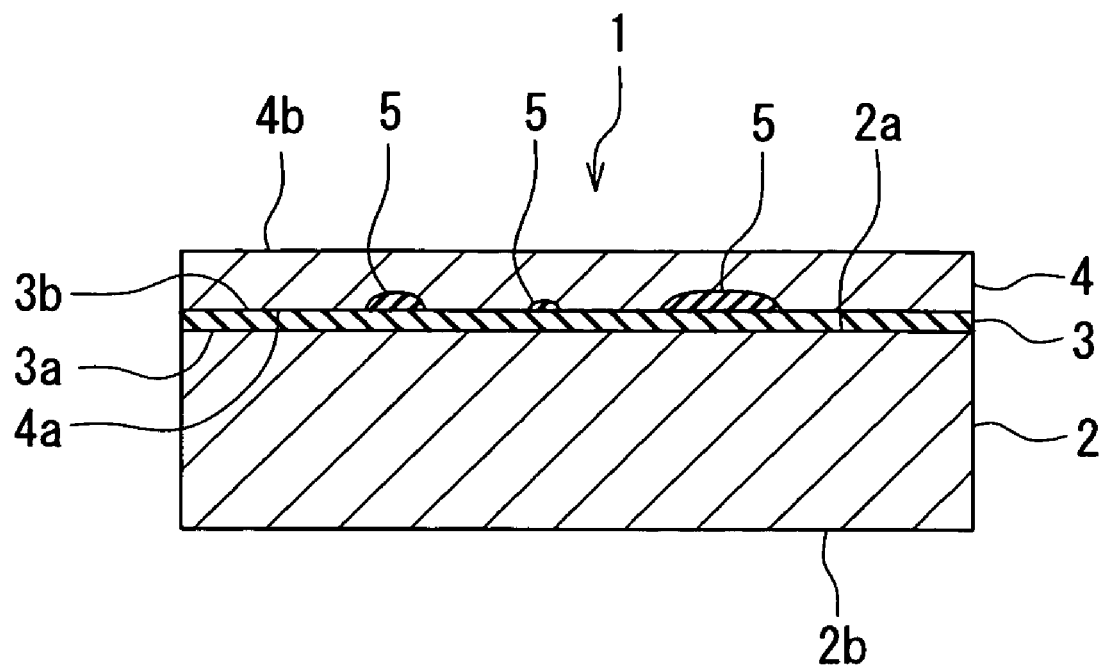
FIG. 1 is a cross-sectional view of a capacitor of a first embodiment of the invention.

Preferred embodiments of the invention will now be described in detail with reference to the accompanying drawings. Reference is now made to FIG. 1 to describe the configuration of a capacitor of a first embodiment of the invention. FIG. 1 is a cross-sectional view of the capacitor of the embodiment. As shown in FIG. 1, the capacitor 1 of the embodiment comprises: a lower electrode 2 formed of a foil made of a polycrystalline metal; an upper electrode layer 4; and a dielectric layer 3 disposed between the lower electrode 2 and the upper electrode layer 4.

The lower electrode 2 has a top surface 2a facing the dielectric layer 3, and a bottom surface 2b opposite to the top surface 2a. Since the lower electrode 2 is polycrystalline, it is made up of a number of crystals, which is different from an amorphous structure, and there appear crystal grain boundaries at the top surface 2a. The crystal grain diameter is around 1 to 500 μm when evaluated by converting the shape of a representative crystal grain obtained by observation at the surface using a microscope into a circular shape based on the area of the crystal grain. The material of the lower electrode 2 may be chosen from various known metal materials. To be specific, the material of the lower electrode 2 may be platinum, copper, nickel, or an alloy of these metals. The lower electrode 2 may be made up of a single layer or a plurality of stacked layers of different materials. The lower electrode 2 has a thickness of 10 to 200 μm inclusive, for example. The lower electrode 2 formed of a foil made of a polycrystalline metal also has a function of a base body. Therefore, it is not necessary to provide a substrate that underlies the lower electrode 2 to support the lower electrode 2. However, the lower electrode 2 may be bonded to a substrate for objectives such as an improvement in handleability.

It is preferred that the foil used as the lower electrode 2 be the one that has undergone heat treatment in advance by itself. This is because a foil that has not undergone heat treatment in advance may bend later by receiving heat when the dielectric layer 3 or the upper electrode layer 4 is formed.

The polycrystalline metal that forms the lower electrode 2 may contain impurities. Furthermore, in the polycrystalline metal, there may be grain boundary segregation wherein the concentration of impurities is higher at the grain boundaries than in the crystal grains.

The upper electrode layer 4 has a bottom surface 4a facing the dielectric layer 3, and a top surface 4b opposite to the bottom surface 4a. The material of the upper electrode layer 4 may be chosen from various known conductive materials. To be specific, the material of the upper electrode layer 4 may be platinum, copper, nickel, or an alloy of these metals. The upper electrode layer 4 may be made up of a single layer or a plurality of stacked layers of different materials. Since the lower electrode 2 has the function of a base body, it is not necessary that the upper electrode layer 4 be as thick as the lower electrode 2. The lower limit of the thickness of the upper electrode layer 4 is 0.2 μm, for example. The upper limit thereof is around 50 μm for the sake of productivity although there is no specific limitation.

The dielectric layer 3 has a bottom surface 3a facing the top surface 2a of the lower electrode 2, and a top surface 3b facing the bottom surface 4a of the upper electrode layer 4. The material of the dielectric layer 3 may be chosen from various known materials having high permittivity. To be specific, the material of the dielectric layer 3 may be the one whose main component is a high-permittivity material including: a titanate material such as $CaTiO_3$, $BaTiO_3$, $SrTiO_3$, $Bi_2TiO_5$, $Bi_4Ti_3O_{12}$, $La_2TiO_5$, $CeTiO_4$, $PbTiO_3$, and $ZrTiO_3$; a stannate material such as $BaSnO_3$, $SrSnO_3$, and $PbSnO_3$; a zirconate material such as $BaZrO_3$, $CaZrO_3$, and $Bi_4Zr_3O_{12}$; a niobate material such as $MgNbO_3$, $CaNbO_3$, $SrNbO_3$, $BaNbO_3$, and $PbNbO_3$; a tantalate material such as $LiTaO_3$, $BaTaO_3$, $SrTaO_3$, $CaTaO_3$, $MgTaO_3$, and $SrBi_2Ta_2O_9$; a bismuth-layer material such as $Bi_3TiNbO_9$, $PbBi_2Nb_2O_9$, $Bi_4Ti_3O_{12}$, $Bi_2SrTa_2O_9$, $Bi_2SrNb_2O_9$, $Sr_2Bi_4Ti_5O_{18}$, and $Ba_2Bi_4Ti_5O_{18}$. A low-permittivity material such as a resin is not preferred as the material of the dielectric layer of the present invention since the capacitance of the capacitor is low if such a material is used. The thickness of the dielectric layer 3 is within a range of 0.1 to 2 μm inclusive, for example, so as to obtain both of a high capacitance and a low leakage characteristic.

The capacitor 1 further comprises a resin insulator 5 that is disposed between the top surface 3b of the dielectric layer 3 and the bottom surface 4a of the upper electrode layer 4 and that is present only in part of a region in which the top surface 3b of the dielectric layer 3 and the bottom surface 4a of the upper electrode layer 4 face each other. The resin insulator 5 is disposed to cover at least part of the crystal grain boundaries appearing at the top surface 2a of the lower electrode 2 when seen from above the top surface 3b of the dielectric layer 3. In addition, the resin insulator 5 is disposed along at least part of the grain boundaries appearing at the top surface 2a of the lower electrode 2 when seen from above the top surface 3b of the dielectric layer 3. The resin insulator 5 is made of an insulating resin. The thickness of the resin insulator 5 is within a range of 0.1 to 50 μm inclusive, for example. Alternatively, in place of the resin insulator 5, an insulator made of a material containing a resin and another dielectric material, such as a material containing a resin and dielectric ceramic particles dispersed in the resin, may be provided. Another alternative is to provide an insulator that does not contain any resin but is made of a dielectric material other than a resin, such as a material containing a dielectric ceramic, in place of the resin insulator 5.

The capacitor 1 may further comprise a protection layer to cover the top surface 4b of the upper electrode layer 4.

In the capacitor 1 of the embodiment, it is required that the lower electrode 2 formed of a foil made of a polycrystalline metal have a self-retaining function as the base body. Therefore, the foil used as the lower electrode 2 preferably has a thickness of 10 μm or greater, and more preferably 20 μm or greater. If the thickness of the foil is smaller than the lower limit of this range, the foil is likely to be wrinkled, for example, and it is therefore difficult to handle the foil. Considering the productivity of the foil, the thickness of the foil is preferably 200 μm or smaller.

The foil, which thus needs to have a thickness much greater than that of a thin film, is fabricated by rolling or electroplating. As a result, the impurities content of the foil is higher than that of a thin-film electrode layer made of an expensive high-purity material. A foil formed by rolling contains impurities of 200 to 6000 ppm, for example. A foil formed by electroplating contains impurities of 30 to 1000 ppm, for example. Therefore, the impurities content of the lower electrode 2 formed of a foil ranges from 30 to 6000 ppm inclusive, for example. As previously described, since the foil is greater than a thin film in thickness, an absolute amount of impurities contained therein is greater. As a result, segregation of impurities is likely to occur in the foil. Furthermore, in a foil made of a polycrystalline metal, grain boundary segregation is likely to occur wherein the concentration of impurities is higher at grain boundaries than in crystal grains. Because of the foregoing, it is assumed that a large region in which the concentration of impurities is high is formed particularly at grain boundaries. On the other hand, the cost for the foil rises if the impurities content falls below the lower limit of the above-mentioned range. If the impurities content exceeds the upper limit of the above-mentioned range, there arise problems that, for example, diffusion of impurities into the dielectric layer becomes noticeable and the capacitance of the capacitor is thereby reduced.

Figure 2:
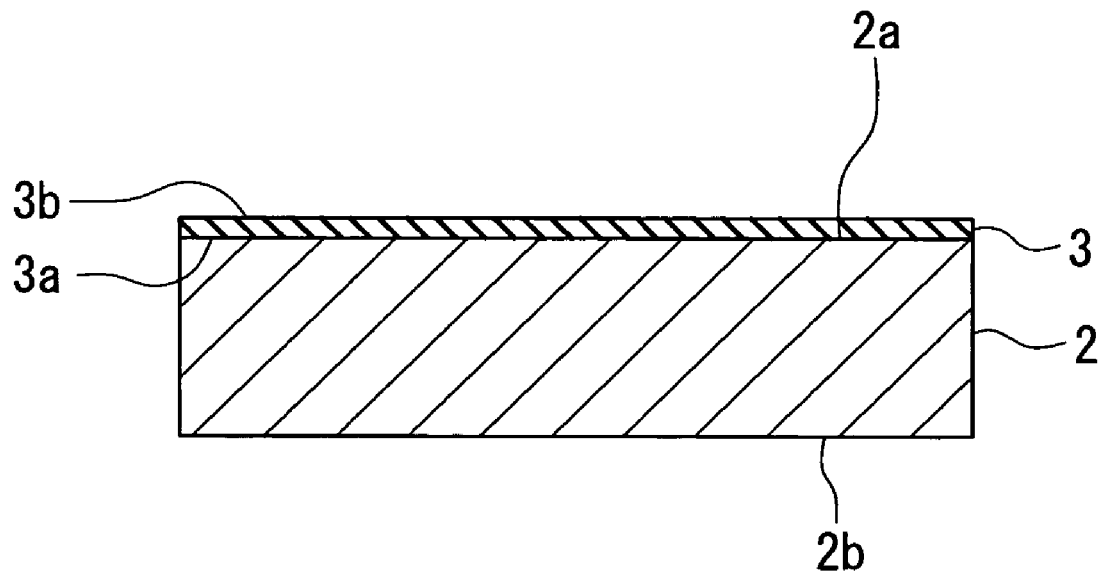
FIG. 2 is a cross-sectional view illustrating a step of a method of manufacturing the capacitor of the first embodiment of the invention.

Reference is now made to FIG. 2 to FIG. 5 to describe a method of manufacturing the capacitor 1 of the embodiment. FIG. 2 is a cross-sectional view illustrating a step of the method of manufacturing the capacitor 1 of the embodiment. In the method, first, as shown in FIG. 2, the dielectric layer 3 is formed on the top surface 2a of the lower electrode 2 by sputtering, for example. It is preferred that, before forming the dielectric layer 3, heat treatment be given to a foil used as the lower electrode 2 at a temperature equal to or higher than the temperature of future heat treatment to be performed after the dielectric layer 3 is formed. It is also preferred that flattening processing by polishing, for example, be performed on the top surface 2a of the lower electrode 2 before the dielectric layer 3 is formed.

Figure 3:
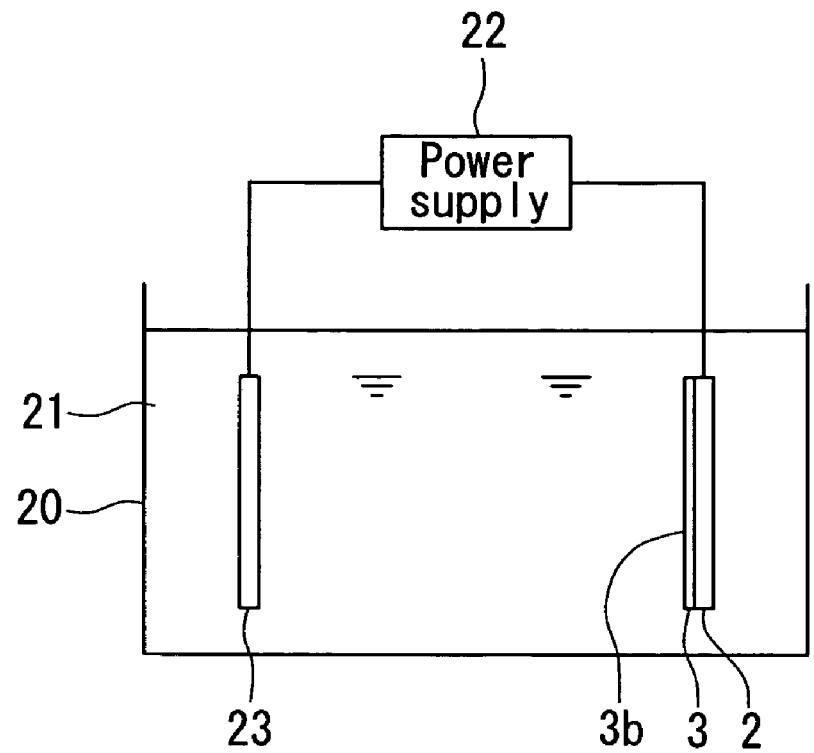
FIG. 3 is a view for illustrating an electrodeposition processing apparatus used in a step that follows the step of FIG. 2.
Figure 4:
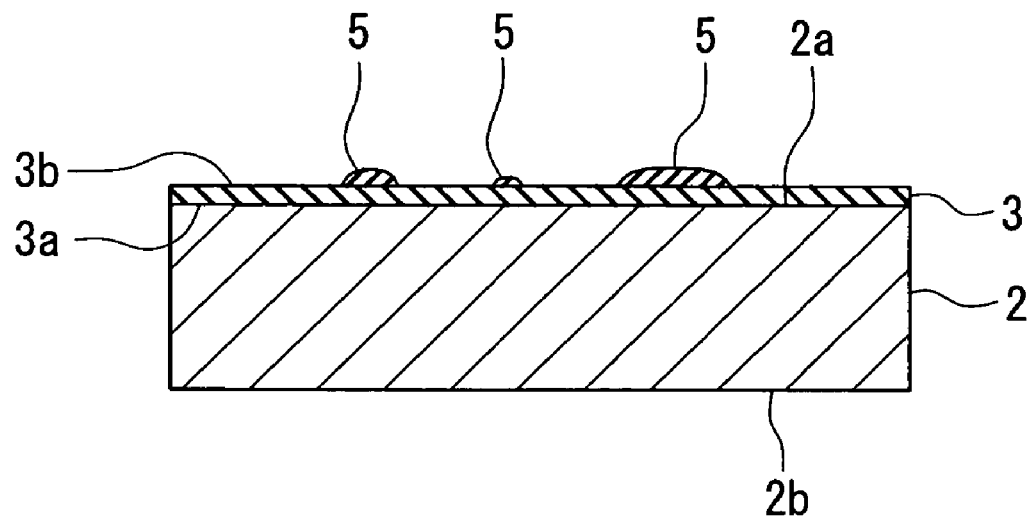
FIG. 4 is a cross-sectional view illustrating the step that follows the step of FIG. 2.

FIG. 3 and FIG. 4 illustrate the following step. In this step, the resin insulator 5 is formed on the top surface 3b of the dielectric layer 3 by electrophoresis. In the following description, causing a substance to be precipitated by electrophoresis is called electrodeposition. A substance precipitated by electrophoresis is called an electro-deposit. A step of forming an electro-deposit is called an electrodeposition step. FIG. 3 is a simplified view of an electrodeposition processing apparatus used in the electrodeposition step. The electrodeposition processing apparatus includes a bath 20 that accommodates an electrodeposition solution 21, and a power supply 22. In the electrodeposition step, an opposite electrode 23 and a layered structure including the lower electrode 2 and the dielectric layer 3 are soaked in the solution 21. The layered structure and the opposite electrode 23 are disposed such that the top surface 3b of the dielectric layer 3 and the electrode 23 face each other. The lower electrode 2 and the electrode 23 are connected to the power supply 22. Through the power supply 22, a voltage is applied between the lower electrode 2 and the electrode 23. The electrode 23 is made of a material that is not subject to corrosion by the solution 21. To be specific, preferable examples of the material of the electrode 23 include platinum, carbon, nickel and stainless steel, which are resistant to corrosion. A wafer plating apparatus, for example, is suitable as the electrodeposition processing apparatus.

In the electrodeposition step, masking is given to the bottom surface 2b of the lower electrode 2 to prevent the electrodeposit from adhering onto the bottom surface 2b. Since the lower electrode 2 formed of a foil is thin, it is preferred that the lower electrode 2 be held by a separately prepared support plate while processing in the electrodeposition step is performed. For example, if the lower electrode 2 is formed of a foil made of a magnetic metal, the lower electrode 2 is fixed by a magnet to a separately prepared nonmagnetic support plate through a method that will now be described. A plastic magnet in the shape of a flat plate having a thickness of about 2 millimeters (mm) is bonded to a silicon wafer with a thermal oxide film, and a silicone rubber having a thickness of 0.5 mm is further laid over the plastic magnet. The lower electrode 2 is then attracted onto the silicone rubber such that the dielectric layer 3 faces outward. After electrodeposition, the layered structure including the lower electrode 2, the dielectric layer 3 and the resin insulator 5 together with the silicone rubber are detached from the plastic magnet and the silicon wafer. Through this method, even if a thin foil is used as the lower electrode 2, it is possible to easily handle the layered structure including the lower electrode 2 and to prevent the electrodeposit from adhering onto the bottom surface 2b of the lower electrode 2.

An example of the electrodeposition step to form the resin insulator 5 will now be specifically described. In this example, the resin insulator 5 is formed using an electrodeposition coating that contains a resin used for electrodeposition. In the following description, a resin used for electrodeposition is called an electrodeposition resin. In this case, the solution 21 is a solution of the electrodeposition coating. A solvent to be used in this solution is a solution containing acid or alkali or a metallic salt thereof in such a concentration that the lower electrode 2 and the dielectric layer 3 are not easily dissolved. The electrodeposition coating is preferably the one having a solid content of about 1 to 25 weight percent, which facilitates formation of the electro-deposit. The conductivity of the solution 21 is preferably within a range of 100 to 2000 μS/centimeters (cm) inclusive. It suffices that the resin insulator 5 formed of the electrodeposition coating has such a thickness that the electrical insulation is secured. To be specific, the thickness of the resin insulator 5 is preferably within a range of 0.1 to 50 μm inclusive, which is appropriately determined in accordance with the type of the electrodeposition resin. This thickness is controlled by the voltage applied, for example.

Types of electrodeposition resin include anion resins and cation resins, either of which may be used for the embodiment. The cation resins are preferred in some cases, since they have higher rust-resistance and higher throwing power (uniformity in electrodeposition) compared with the anion resins, thereby securing the stability of electrodeposition coatings and facilitating control. However, in the case of a perovskite oxide dielectric layer, reduction of the dielectric layer may occur when electrodeposition is performed and the permittivity may be decreased. Therefore, anion resins are preferred for a perovskite oxide dielectric layer so that the dielectric layer is oxidized.

Known resins may be used as the skeleton resin of the electrodeposition resin. To be specific, any of acrylic resins, epoxy resins, fluoroplastics, urethane resins, polybutadiene resins and polyimide resins can be appropriately selected as the skeleton resin of the electrodeposition resin. Alternatively, two or more of the above-listed resins may be used in combination as the skeleton resin of the electrodeposition resin. It is also preferred that a solution containing a polyimide precursor resin such as polyamic acid salt be used as the solution 21 to form a thin film of polyamic acid by electrodeposition, and then this thin film be dehydrated by heating to form a polyimide resin film, and this film be used as the insulator 5.

If the electrodeposition resin is a cation resin, the electrodeposition resin migrates to the cathode side and precipitates. Therefore, in this case, the lower electrode 2 is allowed to function as the cathode while the opposite electrode 23 as the anode. If the electrodeposition resin is an anion resin, the electrodeposition resin migrates to the anode side and precipitates. Therefore, in this case, the lower electrode 2 is allowed to function as the anode while the opposite electrode 23 as the cathode.

To cause migration in electrophoresis and precipitation of the electrodeposition resin, the electrodeposition solution 21 contains such a functional group that ionization occurs in the water and precipitation occurs on the side of the dielectric layer 3. This functional group is typically an amino group if the electrodeposition resin is a cation resin. The solution 21 may contain a bridging agent or a catalyst for promoting a bridging reaction.

In the electrodeposition step, a voltage is applied between the lower electrode 2 and the opposite electrode 23 by the power supply 22. Although electrodeposition can be performed by either the constant voltage method or the constant current method, the constant voltage method is preferred for the sake of withstand voltage assurance as will be described later. In each of the case of employing the constant voltage method and the case of employing the constant current method, the point at which electrodeposition is completed can be determined based on the period of time of electrodeposition or the coulomb amount, for example. The voltage applied between the lower electrode 2 and the opposite electrode 23 (hereinafter called an applied voltage) is preferably within a range of 1 to 200 volts inclusive, and more preferably 2 to 30 volts inclusive. If the applied voltage is below the lower limit of this range, it takes a long time for electrodeposition. If the applied voltage is higher than the upper limit of this range, a great part of the dielectric layer is covered with the electrodeposit, and the capacitance of the capacitor is thereby reduced. The applied voltage is preferably not lower than 1.5 times the rated voltage of the capacitor 1 and not higher than 10 times the rated voltage of the capacitor 1, and more preferably not lower than 2 times the rated voltage of the capacitor 1 and not higher than 5 times the rated voltage of the capacitor 1. By selecting the applied voltage within such a range to make it higher than the rated voltage, the reliability of the capacitor 1 is improved and the capacitance thereof is secured. That is, by performing the electrodeposition processing with an applied voltage not lower than 1.5 times the rated voltage of the capacitor 1, it is possible that a portion that would be punctured when a voltage equal to or lower than the applied voltage is impressed is forcedly punctured, and that this portion is immediately repaired by the resin insulator 5 formed by electrodeposition. It is thereby possible to secure the rated voltage and long-term reliability of the capacitor 1 with certainty. For a thin-film capacitor in which the thickness of the dielectric layer is small and it is difficult to form a uniform film, a conventional technique for increasing the withstand voltage is to increase the thickness of the dielectric layer or to multilayer the dielectric layer. However, since the withstand voltage test is a destructive test, there has been no method for assuring the withstand voltage of the specifications with reliability, and manufacturing capacitors above specs in consideration of variations has been the only way to assure the withstand voltage. According to the embodiment, in contrast, a predetermined high voltage is applied in the electrodeposition processing so as to willfully puncture a portion in which the withstand voltage is low and to repair the punctured portion at the same time. Portions of the dielectric film that have a low withstand voltage and that will be broken by a future withstand voltage test are thereby processed at once with reliability so as to enable assurance of the withstand voltage.

In the electrodeposition step, in each of the case of employing the constant voltage method and the case of employing the constant current method, it is preferred that a low voltage or current be applied at an early stage of electrodeposition, and then the voltage or current be increased gradually or step by step to a desired value. This is because, if a large current is abruptly fed at an early stage, the electro-deposit is made rough and/or bubbles are produced in the electro-deposit, so that a sufficient insulation characteristic is not obtained therein, or the electro-deposit is made to have a shape protruding from the top surface 3b of the dielectric layer 3 to an extent more than required. In the electrodeposition step, in a case in which the final applied voltage is 20 volts, for example, the applied voltage is gradually increased from an initial voltage of 0 volt to 20 volts over 10 to 180 seconds, and then the voltage is maintained at 20 volts for 5 to 600 seconds.

In the electrodeposition step, an electro-deposit made from the electrodeposition resin is selectively formed on a portion of the top surface 3b of the dielectric layer 3 where a current flows. Since this electro-deposit has a high electrical resistance, when the thickness of the electro-deposit has reached a specific value, no current flows through the electro-deposit and the growth of the electro-deposit is automatically stopped. This electro-deposit becomes the resin insulator 5.

It is preferred that, after the electrodeposition step, the electro-deposit made from the electrodeposition resin be cured by heat treatment so as to increase the electrical resistance and reduce the hydroscopic amount of the resin insulator 5 made of the electro-deposit to thereby achieve higher reliability. It is preferred that the heat treatment to the electro-deposit be performed in the air or an atmosphere of nitrogen or other gases, or in a vacuum at a temperature of 80° C. to 350° C. for about 10 to 120 minutes.

Figure 5:
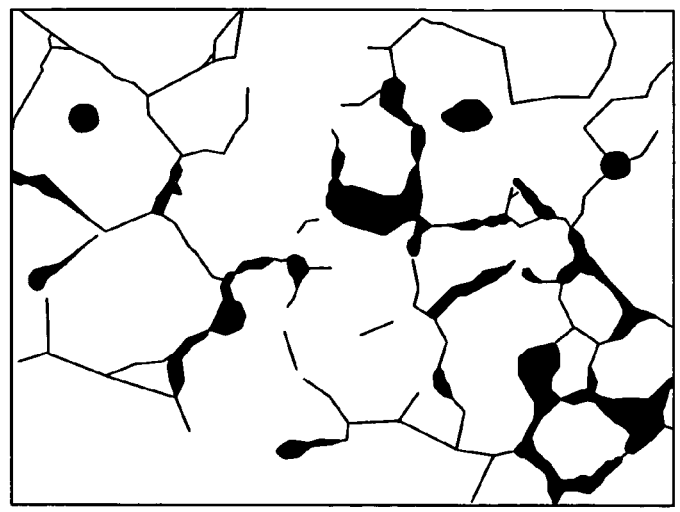
FIG. 5 is a view for illustrating a resin insulator of the capacitor of the first embodiment of the invention seen from above the top surface of the dielectric layer.

FIG. 4 illustrates the layered structure at a point when the resin insulator 5 has been formed. In the electrodeposition step, the resin insulator 5 is formed to extend along at least part of the grain boundaries appearing at the top surface 2a of the lower electrode 2 and to cover the at least part of the grain boundaries when seen from above the top surface 3b of the dielectric layer 3. FIG. 5 is a view for illustrating the resin insulator 5 seen from above the top surface 3b of the dielectric layer 3. In FIG. 5, the solidly shaded portions indicate the resin insulator 5. In FIG. 5, the lines indicate portions in which the resin insulator 5 is slightly formed, or indicate grain boundaries appearing at the top surface 2a of the lower electrode 2 seen through the dielectric layer 3. The reason why the resin insulator 5 is formed in such a shape will be described later in detail. The size of each dielectric particle forming the dielectric layer 3, which can be evaluated by observing the cross section, is much smaller than the size of each particle of the foil forming the lower electrode 2, and equal to or smaller than one twentieth of the thickness of the dielectric layer 3.

The following is a detailed description of an example of electrodeposition step for a case in which an insulator composed of a resin and dielectric ceramic particles dispersed in the resin is formed in place of the resin insulator 5. The electrodeposition coating used in this example is the one obtained by dispersing particulates of dielectric ceramic in the electrodeposition resin. The dielectric ceramic used may be barium titanate, strontium titanate or calcium titanate, for example, having a perovskite structure. The particulates have a diameter of 3 to 20 nm inclusive, for example. The particulates are treated in advance with an appropriate surface-active agent such as the one containing nitrogen or fluorine so as to carry an electrical charge. In the electrodeposition step using this electrodeposition coating, an electro-deposit containing the electrodeposition resin and the above-mentioned particulates is selectively formed on a portion of the top surface $3b$ of the dielectric layer 3 where a current flows. This electrodeposit becomes the insulator composed of the resin and the dielectric ceramic particles dispersed in the resin.

The following is a detailed description of an example of electrodeposition step for a case in which an insulator composed of dielectric ceramic particles is formed in place of the resin insulator 5. The electrodeposition solution 21 used in this example is the one obtained by suspending dielectric particulates having an electrical charge in a solution containing no electrodeposition resin. The solution 21 may be formed in the following manner. First, dielectric ceramic particulates predominantly composed of $BaTiO_3$ are added to a mixed solution of acetone and ethanol, and preliminary dispersing processing is performed using a ballmill to form a slurry. Next, acetone, ethanol, a surface-active agent, and the slurry are mixed and the mixture is subjected to ultrasonic dispersing processing to obtain the solution 21. In the electrodeposition step using the solution 21, only the dielectric particulates migrate in electrophoresis, and selectively deposit on the portion of the top surface $3b$ of the dielectric layer 3 where a current flows, thereby forming the insulator composed of an aggregate of the particulates. After the electrodeposition step, the insulator may be sintered at a temperature of 500° C. or higher. It is thereby possible to increase the permittivity of the insulator.

After the electrodeposition step, as shown in FIG. 1, the upper electrode layer 4 is formed by sputtering, for example, on the top surface $3b$ of the dielectric layer 3 and the resin insulator 5 to complete the capacitor 1.

Figure 6:
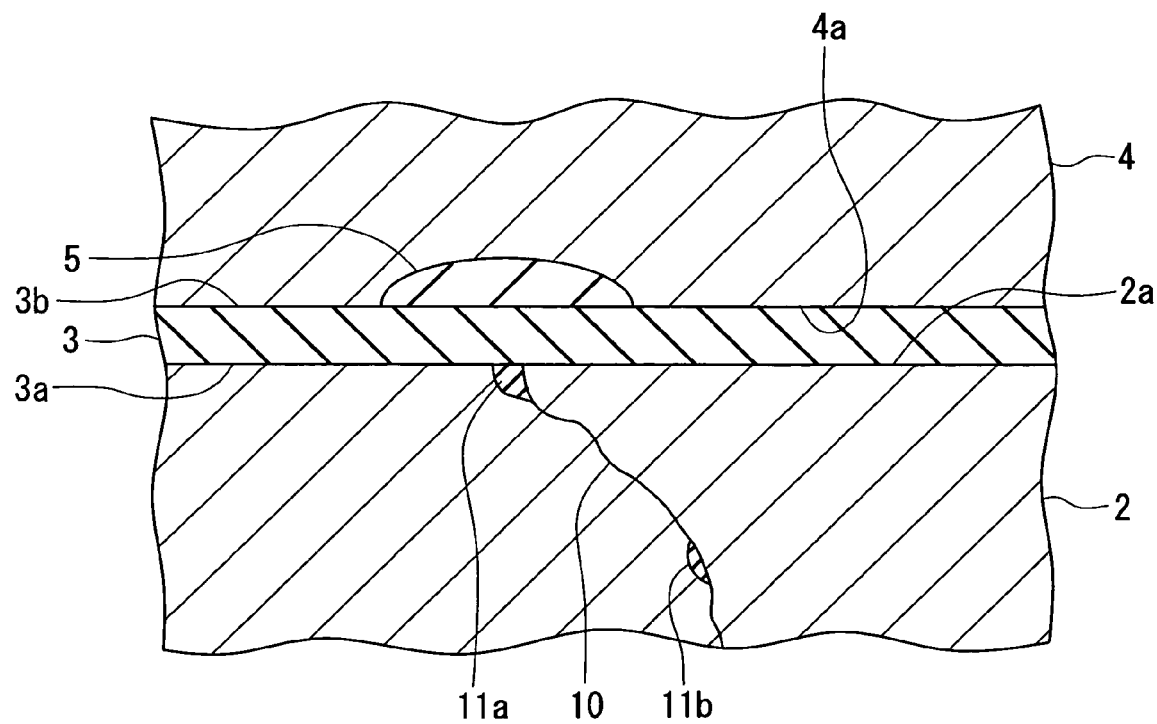
FIG. 6 is a cross-sectional view schematically illustrating a portion of the capacitor of the first embodiment of the invention.
Figure 7:
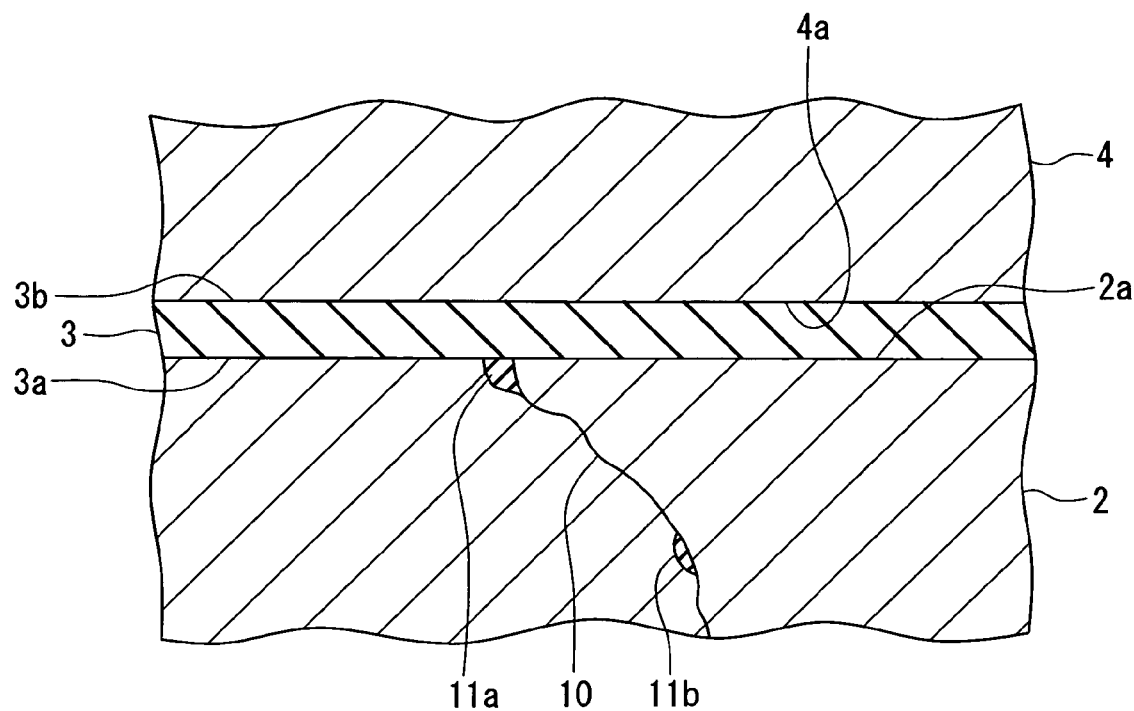
FIG. 7 is a cross-sectional view schematically illustrating a portion of a capacitor in which no resin insulator is provided.

Reference is now made to FIG. 6 and FIG. 7 to describe features of the capacitor 1 of the embodiment and the method of manufacturing the same in detail. FIG. 6 is a cross-sectional view schematically illustrating a portion of the capacitor 1 of the embodiment. FIG. 7 is a cross-sectional view schematically illustrating a portion of a capacitor in which the resin insulator 5 is not provided.

The capacitor of FIG. 7 will be first described. The capacitor has a configuration the same as that of the capacitor 1 of the embodiment except that the capacitor does not incorporate the resin insulator 5. In FIG. 7, numeral 10 indicates a crystal grain boundary of the polycrystalline metal forming the lower electrode 2. In this capacitor, there are some cases in which leakage current of the dielectric layer 3 increases or a short-circuit failure occurs even if the dielectric layer 3 has no defects.

The inventors of the present patent application examined the above phenomenon in detail and found that a great amount of leakage current flowed near at least part of the grain boundary 10 appearing at the top surface $2a$ of the lower electrode 2. The inventors sought the reason and found that the polycrystalline metal forming the lower electrode 2 contained impurities, and there was grain boundary segregation in the polycrystalline metal, that is, the concentration of impurities was higher at the grain boundary 10 than in the crystal grains.

In FIG. 7, numerals $11a$ and $11b$ indicate regions in which impurities segregate due to grain boundary segregation. The region $11a$ exists near the top surface $2a$ of the lower electrode 2. The region $11b$ exists inside the lower electrode 2. It was found that, with regard to an increase in leakage current and an occurrence of short-circuit failure, the region $11b$ would be insignificant but the region $11a$ would be a cause of an increase in leakage current and an occurrence of short-circuit failure. This will now be described in detail.

The inventors found that minute insulating portions mainly made of oxides of impurities were formed in the regions $11a$ and $11b$ and that such a phenomenon noticeably occurred in a foil that had undergone a sort of heat treatment. When a rolled nickel foil was used as the lower electrode 2, impurities were mainly Si and Ti, and great amounts of $SiO_2$ and $TiO_2$ existed in the regions $11a$ and $11b$. When an electrolytic nickel foil formed by electroplating was used as the lower electrode 2, impurities were Fe and Si, for example, and great amounts of iron oxide and $SiO_2$ existed in the region $11a$. At triple points of the grain boundary, in particular, there were many such regions in which impurities segregated due to grain boundary segregation.

If the insulating portion (the region $11a$) exists near the top surface $2a$ of the lower electrode 2, although the top surface $2a$ is physically flat, it can be said that a minute concave exists at the top surface of a portion made up of the metal that is the principal phase of the lower electrode 2 if this portion is only focused. When a voltage is applied between the lower electrode 2 and the upper electrode layer 4, it is more likely that a current concentrates in edge portions of the above-mentioned concave, compared with portions around the concave. Therefore, it is assumed that leakage current is likely to increase in portions of the dielectric layer 3 near the concave. In addition, it is assumed that puncture occurs in a portion of the dielectric layer 3 where a particularly large leakage current flows, and a defect thereby occurs in the dielectric layer 3 to cause a short-circuit failure. However, since the state of the grain boundary 10 appearing at the top surface $2a$ of the lower electrode 2 is not uniform, the degree of increase in leakage current in the dielectric layer 3 is not uniform in every portion corresponding to the grain boundary 10 appearing at the top surface $2a$ of the lower electrode 2.

The features of the capacitor 1 of the embodiment shown in FIG. 6 will now be described. In the method of manufacturing the capacitor 1 of the embodiment, in the electrodeposition step, a voltage is applied between the lower electrode 2 and the opposite electrode 23 soaked in the solution 21. On this occasion, currents concentrate, according to the principle previously described, in a neighborhood of at least part of the grain boundary 10 appearing at the top surface $2a$ of the lower electrode 2. Consequently, a current sufficient for forming the resin insulator 5 by electrodeposition flows in a portion of the dielectric layer 3 corresponding to at least part of the grain boundary 10 appearing at the top surface $2a$ of the lower electrode 2. As a result, the resin insulator 5 is formed to extend along at least part of the grain boundary 10 appearing at the top surface $2a$ of the lower electrode 2 and to cover the at least part of the grain boundary 10 when seen from above the top surface $3b$ of the dielectric layer 3.

In the manner thus described, in the capacitor 1 of the embodiment, the resin insulator 5 is selectively disposed on the portion of the dielectric layer 3 where leakage current would increase if the resin insulator 5 were not provided. As a result, according to the embodiment, it is possible to prevent an increase in leakage current of the dielectric layer 3 and an occurrence of short-circuit failure resulting from the grain boundary 10 appearing at the top surface 2a of the lower electrode 2, not resulting from defects of the dielectric layer 3.

To suppress an increase in leakage current, it is preferred to perform electrodeposition by the constant voltage method. This is because an electro-deposit is formed in a greater thickness in a region where a larger amount of current flows, according to the constant voltage method.

In the electrodeposition step, the resin insulator 5 is formed also in portions of the dielectric layer 3 where short-circuit occurs because of defects such as pinholes. Therefore, according to the embodiment, it is also possible to repair the portions of the dielectric layer 3 where short-circuit occurs because of defects.

The following is a description of the results of an experiment performed for evaluating the characteristics of the capacitor 1 of a first example of the embodiment and those of a reference capacitor. The capacitor 1 of the first example of the embodiment incorporates the resin insulator 5. The capacitor 1 of the first example was fabricated through the following steps. First, heat treatment was given to a rolled nickel foil having a thickness of 50 μm at a temperature of 1000° C. in a nitrogen atmosphere, and then buffing was performed to flatten the surface. This nickel foil was used as the lower electrode 2. Next, the dielectric layer 3 made of barium titanate and strontium having a thickness of 500 nm was formed on the top surface 2a of the lower electrode 2 by metal organic decomposition (MOD). A layer formed by MOD will be hereinafter called an MOD layer. To be specific, the dielectric layer 3 was formed in the following manner. That is, a process of forming a single MOD layer approximately 100 nm in thickness by spray coating and subjecting the MOD layer to heat treatment on a hot plate at a temperature of 400° C. in the air was repeated five times, and then rapid heat treatment was performed at a temperature of 900° C. in a reducing atmosphere to thereby form the dielectric layer 3 having a high permittivity. Next, a resin film to be the resin insulator 5 was formed through the electrodeposition step using a novolac-base anion electrodeposition resist (the PEPR 2400 manufactured by Rohm and Haas Company) as the electrodeposition resin. This electrodeposition step was performed such that the voltage applied between the lower electrode 2 and the opposite electrode 23 was gradually increased from 0 to 20 volts over 30 seconds, and then the voltage was maintained at 20 volts for three minutes. Next, the layered structure was cleaned with ultra pure water and temporarily dried at a temperature of 100° C. Next, heat treatment was given to the layered structure in a nitrogen atmosphere at a temperature of 320° C. to thermoset the resin film to thereby form the resin insulator 5. Next, the upper electrode layer 4 made of copper and having a thickness of 200 nm was formed by sputtering on the resin insulator 5 and the top surface 3b of the dielectric layer 3 to complete the capacitor 1 of the example.

The reference capacitor was fabricated in a manner the same as that of the capacitor 1 of the example of the embodiment except that the resin insulator 5 was not formed.

The result of analyzing impurities contained in the nickel foil used as the lower electrode 2 is shown in the table 1 below. As shown in the table 1, the impurities contained in the nickel foil were mainly Si and Ti and the contents thereof were 574 ppm and 342 ppm, respectively.

TABLE 1

| | Impurities | | | | | | | | |
|---|---|---|---|---|---|---|---|---|---|
| | Mg | Al | Si | P | Ti | Cr | Mn | Fe | Total |
| Content (ppm) | 58 | 43 | 574 | 7 | 342 | 7 | 9 | 59 | 1098 |

In the experiment, a number of samples were fabricated for each of the capacitor 1 of the example of the embodiment and the reference capacitor, the samples being different in the area of the bottom surface 4a of the upper electrode layer 4, that is, the area of the region in which the lower electrode 2 and the upper electrode layer 4 are opposed to each other with the dielectric layer 3 disposed in between (the area will be hereinafter called an electrode-opposed area). In the experiment, for each of the samples, a voltage of 2 volts was applied between the lower electrode 2 and the upper electrode layer 4 to examine leakage current (A/cm$^2$) and whether a short-circuit occurred or not. The table 2 below shows the leakage current (A/cm$^2$) and the rate of occurrences of short-circuit (%) (hereinafter referred to as the short-circuit rate) for each of three types of electrode-opposed areas (mm$^2$) of each of the capacitor 1 of the embodiment and the reference capacitor.

TABLE 2

| Electrode-opposed area | Leakage current of capacitor 1 | Leakage current of reference capacitor | Short-circuit rate of capacitor 1 | Short-circuit rate of reference capacitor |
|---|---|---|---|---|
| 1 | $2 \times 10^{-8}$ | $3 \times 10^{-8}$ | 0 | 5 |
| 4 | $3 \times 10^{-8}$ | $4 \times 10^{-5}$ | 0 | 15 |
| 20 | $2 \times 10^{-8}$ | $6 \times 10^{-4}$ | 0 | 50 |

As shown in the table 2, for any of the electrode-opposed areas, the leakage current and the short-circuit rate of the capacitor 1 of the example of the embodiment are smaller than those of the reference capacitor. For the reference capacitor, if the electrode-opposed area increases, the leakage current and the short-circuit rate also increase. For the capacitor 1 of the example, in contrast, the leakage current and the short-circuit rate maintain small values even though the electrode-opposed area increases. These results teach that, according to the embodiment, it is possible to prevent an increase in leakage current of the dielectric layer 3 and an occurrence of short-circuit failure resulting from the grain boundary 10 appearing at the top surface 2a of the lower electrode 2, not resulting from defects of the dielectric layer 3. According to the embodiment, it is possible to implement the capacitor 1 having a great capacitance and a small leakage current since it is possible to maintain the leakage current and the short-circuit rate at small values even if the electrode-opposed area is increased.

In the experiment, leakage current and the short-circuit rate were examined also for capacitors fabricated by changing the voltage applied between the lower electrode 2 and the opposite electrode 23 in the electrodeposition step. As a result, for a capacitor fabricated with this voltage within a range of 1 to 10 volts inclusive, the short-circuit rate was lower compared with the reference capacitor, but the leakage current was not smaller than the one obtained when the applied voltage was 20 volts. It is assumed that this was because, since the voltage was low, only a small current flowed through the dielectric layer 3 during electrodeposition, and formation of the resin insulator 5 was therefore insufficient. For a capacitor fabricated with the voltage within a range of 15 to 35 volts inclusive, the short-circuit rate and the leakage current were both lower, compared with the reference capacitor. For a capacitor fabricated with the voltage of 40 volts or higher, the resin insulator 5 was formed over the entire top surface 3b of the dielectric layer 3. It is assumed that this was because, since the above-mentioned voltage was too high for the dielectric layer of the example, a current flowed through the entire dielectric layer 3 during electrodeposition. As a result of a withstand voltage test, the mean value for the reference capacitor was about 10 volts, but there were some samples that were punctured at a voltage of 5 volts or lower, while none of the samples of the capacitor of the example of the embodiment were punctured at a voltage equal to or lower than the voltage applied when electrodeposition was performed. That is, all of the samples of the capacitor that had undergone the electrodeposition processing at 5 volts had a withstand voltage of 5 volts or higher, and all of the samples of the capacitor that had undergone the electrodeposition processing at 15 volts had a withstand voltage of 15 volts or higher.

If the resin insulator 5 is disposed in the entire region in which the top surface 3b of the dielectric layer 3 and the bottom surface 4a of the upper electrode layer 4 face each other, the space between the lower electrode 2 and the upper electrode layer 4 is made greater than the thickness of the dielectric layer 3 by the thickness of the resin insulator 5, and the resin insulator 5 having a permittivity lower than that of the dielectric layer 3 is electrically connected to the dielectric layer 3 in series. Consequently, the capacitance of the capacitor is made much smaller than a desired value. Therefore, it is unfavorable that the resin insulator 5 be disposed in the entire region in which the top surface 3b of the dielectric layer 3 and the bottom surface 4a of the upper electrode layer 4 face each other. In the embodiment, in contrast, the resin insulator 5 is disposed in only part of the region in which the top surface 3b of the dielectric layer 3 and the bottom surface 4a of the upper electrode layer 4 face each other. In addition, when seen from above the top surface 3b of the dielectric layer 3, the resin insulator 5 is disposed to extend along at least part of the grain boundary 10 appearing at the top surface 2a of the lower electrode 2 and to cover the at least part of the grain boundary 10. In the embodiment, the region in which the resin insulator 5 is disposed is much smaller than the entire region in which the top surface 3b of the dielectric layer 3 and the bottom surface 4a of the upper electrode layer 4 face each other. It is therefore impossible that the capacitance of the capacitor 1 becomes much smaller than a desired value, according to the embodiment. When a polyimide electrodeposition resin was used as the anion electrodeposition resin, effects nearly the same as those of the above-described example were obtained. However, the capacitance density of the capacitor was 2.5 $\mu F/cm^2$, which was lower than that in the case of using the above anion electrodeposition resin, i.e., 4 $\mu F/cm^2$.

Second and third examples of the embodiment will now be described. The second example is the one in which an insulator composed of a resin and dielectric ceramic particles dispersed in the resin was formed in place of the resin insulator 5. The electrodeposition coating used in the second example was the one obtained by dispersing particles of barium titanate 10 nm in particle diameter in an acrylic-base anion electrodeposition resin having a solid content of 10 weight percent. In the electrodeposition coating, the proportion of barium titanate particles with respect to the electrodeposition resin was 25 weight percent. The barium titanate particles had been treated in advance with a fluorine-containing surface-active agent having a molecular weight of 2000. In the second example, after the electrodeposition step, heat treatment at a temperature of 550° C. was given to the layered structure made up of the lower electrode 2, the dielectric layer 3 and the film formed by electrodeposition. The remainder of conditions for the second example were the same as those of the first example. The second example provided characteristics similar to those of the first example.

The third example is the one in which an insulator composed of dielectric ceramic particles was formed in place of the resin insulator 5. In the third example, used as the electrodeposition solution 21 was a suspension prepared by dispersing particles of barium titanate 10 nm in particle diameter in a solution containing no resin. The barium titanate particles had been treated in advance with a fluorine-containing surface-active agent having a molecular weight of 2000. In the third example, after the electrodeposition step, heat treatment at a temperature of 550° C. was given to the layered structure made up of the lower electrode 2, the dielectric layer 3 and the film formed by the electrodeposition. The remainder of conditions for the third example were the same as those of the first example. The third example provided characteristics similar to those of the first example, too.

Second Embodiment

Figure 8:
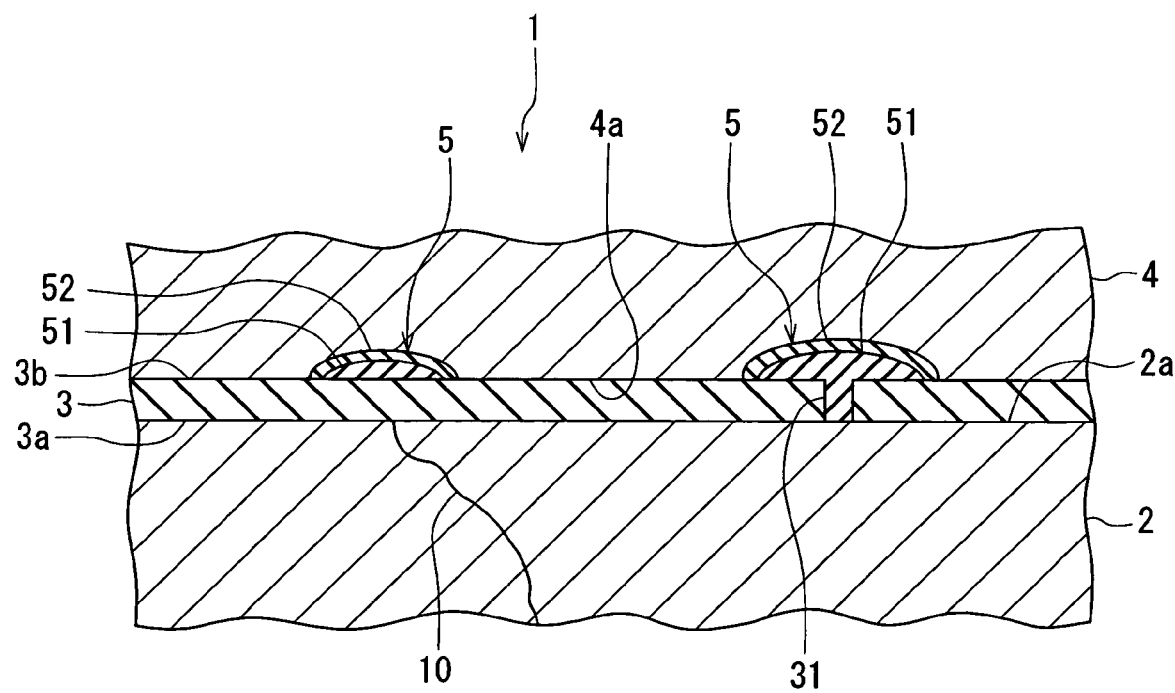
FIG. 8 is a cross-sectional view illustrating a portion of a capacitor manufactured through a method of a second embodiment of the invention.

A method of manufacturing a capacitor of a second embodiment of the invention will now be described. Reference is first made to FIG. 8 to describe the configuration of the capacitor manufactured through the method of the second embodiment. FIG. 8 is a cross-sectional view illustrating a portion of the capacitor. As shown in FIG. 8, the capacitor 1 of the embodiment comprises: the lower electrode 2, the upper electrode layer 4, and the dielectric layer 3 disposed between the lower electrode 2 and the upper electrode layer 4.

The lower electrode 2 is formed of a foil made of a polycrystalline metal, for example. In this case, the lower electrode 2 has a configuration the same as that of the first embodiment. The upper electrode layer 4 of the second embodiment has a configuration the same as that of the first embodiment, too. The dielectric layer 3 of the second embodiment has a defect 31 such as a pinhole. The remainder of configuration of the dielectric layer 3 is the same as that of the first embodiment.

The capacitor 1 further comprises the resin insulator 5 that is disposed between the top surface 3b of the dielectric layer 3 and the bottom surface 4a of the upper electrode layer 4 and that is present only in part of a region in which the top surface 3b of the dielectric layer 3 and the bottom surface 4a of the upper electrode layer 4 face each other. In the second embodiment, at least part of the resin insulator 5 is provided to repair the defect 31 of the dielectric layer 3. The at least part of the resin insulator 5 includes a portion with which the defect 31 is filled and a portion covering the defect 31.

As in the first embodiment, if the lower electrode 2 is formed of a foil made of a polycrystalline metal, another part of the resin insulator 5 is disposed to cover at least part of the grain boundary 10 appearing at the top surface 2a of the lower electrode 2 when seen from above the top surface 3b of the dielectric layer 3.

Reference is now made to FIG. 12 to FIG. 15 to describe the outline of the method of manufacturing the capacitor 1 of the second embodiment.

To obtain the capacitor 1 having a larger capacitance, it is effective to make the dielectric layer 3 thin. However, if the dielectric layer 3 is made thin, the defect 31 is more likely to occur in the dielectric layer 3. If there exists the defect 31 in the dielectric layer 3, an increase in leakage current of the dielectric layer 3 and/or a short-circuit failure can occur. To prevent an increase in leakage current of the dielectric layer 3 and an occurrence of short-circuit failure, it is desirable to perform electrodeposition processing after the dielectric layer 3 is formed, as in the first embodiment, so as to form the resin insulator 5 for repairing the defect 31.

If electrodeposition processing is performed by the constant voltage method, an electro-deposit having a high electrical resistance is thereby formed. As a result, in the electrodeposition processing, the electrical resistance of the electro-deposit increases as time elapses, and the value of the current passing through the defect 31 decreases. Therefore, in the electrodeposition processing, the rate at which the electro-deposit grows gradually decreases, and the growth thereof substantially stops after a lapse of a specific period of time.

Figure 12:
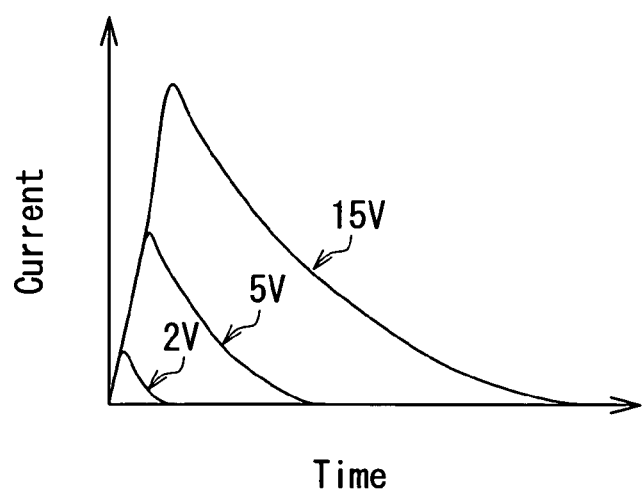
FIG. 12 is a view for illustrating changes in electric current value over time in electrodeposition processing performed once.

FIG. 12 shows a change in value of the above-mentioned current over time in a single electrodeposition processing for each of three cases where applied voltages are 2 volts, 5 volts and 15 volts. As shown in FIG. 12, in any of the cases, the current value abruptly increases at an early stage of the electrodeposition processing, and then gradually decreases. The higher the applied voltage, the greater is the current value. In the electrodeposition processing, the total amount of the electro-deposit corresponds to an accumulation amount of the current values. Therefore, if the electrodeposition processing is performed by the constant voltage method to repair the defect 31, a large current is abruptly fed to the defect 31 at an early stage of the electrodeposition processing, and this results in formation of a large cluster of electro-deposit around the defect 31. The higher the applied voltage, the larger is the cluster of electro-deposit.

Figure 13:
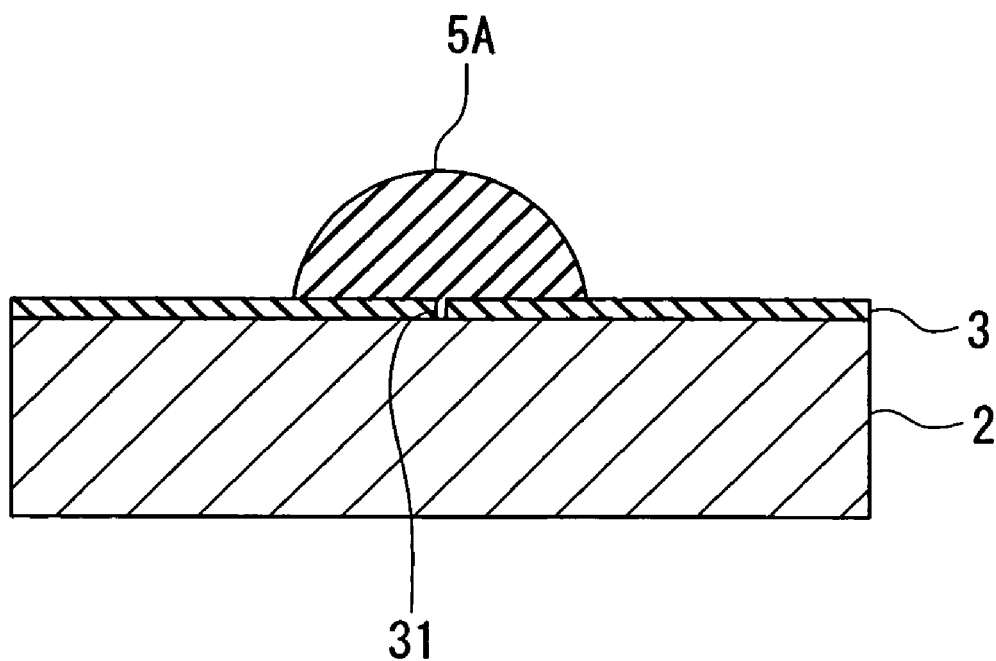
FIG. 13 is a cross-sectional view for illustrating a state in which a large electro-deposit is formed around a defect of the dielectric layer through electrodeposition processing performed once.

An electro-deposit that has been just formed is poor in insulation characteristic for the reasons that, for example, it contains a great amount of water, and that there exists a functional group that supports the giving and receiving of electrons since the electro-deposit is unset. Therefore, in portions such as the defect 31 where a large current flows, the growth of the electro-deposit will not stop until the electro-deposit becomes relatively large. FIG. 13 illustrates a state in which a large electro-deposit 5A is formed around the defect 31 through electrodeposition processing performed once with an applied voltage of 15 volts. When such a large electro-deposit 5A is formed, the electro-deposit 5A may produce bubbles when the electro-deposit 5A is dried afterwards. Consequently, after the upper electrode layer 4 is formed, the upper electrode layer 4 may easily fall off at the interface between the electro-deposit 5A and itself. Furthermore, if a large electro-deposit 5A is formed, there arise such problems that a portion of the upper electrode layer 4 located above the electro-deposit 5A greatly protrudes, it becomes difficult to pattern the upper electrode layer 4, and the effective electrode-opposed area of the capacitor 1 is decreased to cause a reduction in capacitance of the capacitor 1.

In the second embodiment, electrodeposition processing is performed a plurality of times to prevent formation of such an electro-deposit 5A larger than required as described above. A case of performing electrodeposition processing twice will now be described. In this case, after the dielectric layer 3 is formed, the first electrodeposition processing is performed by the constant voltage method to form a first electro-deposit. It is preferred that the applied voltage in the first electrodeposition processing be lower than a final target applied voltage that is required to ensure a desired withstand voltage of the capacitor 1. Next, the layered structure including the lower electrode 2 and the dielectric layer 3 is retrieved from the electrodeposition solution, and processing for increasing the electrical resistance of the first electro-deposit is performed. This processing for increasing the electrical resistance may be processing for drying the electro-deposit, or processing for drying the electro-deposit and further curing the electro-deposit by heating. Through such processing, the water of the electro-deposit is vaporized and the electrical resistance of the electro-deposit is thereby increased. Next, the layered structure including the lower electrode 2 and the dielectric layer 3 is soaked in the electrodeposition solution again, and the second electrodeposition processing is performed by the constant voltage method at the final target applied voltage to form a second electro-deposit to cover the first electro-deposit. Since the first electro-deposit has been increased in electrical resistance by the processing for increasing the electrical resistance, no large current flows through the first electro-deposit in the second electrodeposition processing even though it is performed at the final target applied voltage. Consequently, the thickness of the second electro-deposit is smaller than that of the first electro-deposit. Next, the layered structure including the lower electrode 2 and the dielectric layer 3 is retrieved from the electrodeposition solution, and processing for increasing the electrical resistance of the second electro-deposit is performed. In the case of performing electrodeposition processing three times or more, the applied voltage is increased each time the electrodeposition processing is repeated so that the voltage applied in the electrodeposition processing performed last is the final target applied voltage.

Figure 14:
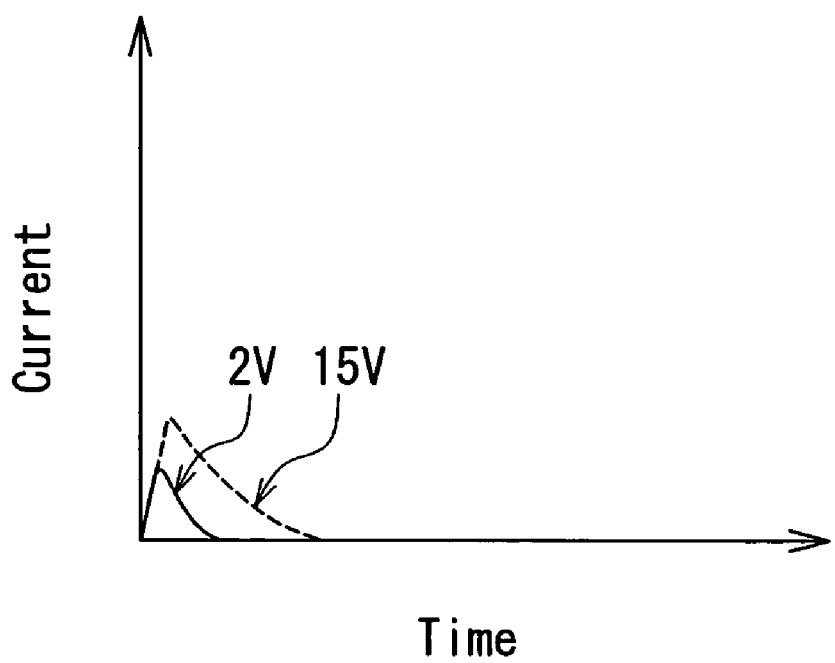
FIG. 14 is a view for illustrating changes in electric current value over time in each electrodeposition processing when electrodeposition processing was performed twice.
Figure 15:
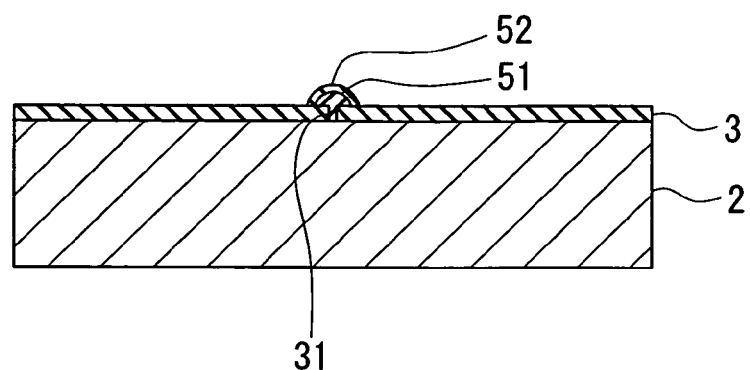
FIG. 15 is a cross-sectional view for illustrating a state in which a two-layer electro-deposit is formed through performing electrodeposition processing twice.

FIG. 14 shows changes in current value over time in each electrodeposition processing in a case in which the first electrodeposition processing was performed at an applied voltage of 2 volts, and the second electrodeposition processing was performed at an applied voltage of 15 volts. FIG. 15 illustrates a state in which a first electro-deposit 51 and a second electro-deposit 52 are formed through performing electrodeposition processing twice in the above-described manner. The size of the first electro-deposit 51 is much smaller than the size of the electro-deposit 5A formed through performing electrodeposition processing once at an applied voltage of 15 volts. Furthermore, as shown in FIG. 14, the total current value obtained in the second electrodeposition processing is much smaller than the total current value obtained in the case where electrodeposition processing is performed once at an applied voltage of 15 volts as shown in FIG. 12. Consequently, the size of the second electro-deposit 52 is also much smaller than that of the electro-deposit 5A formed through electrodeposition processing performed once at an applied voltage of 15 volts. As a result, the size of the resin insulator 5 made up of the electro-deposits 51 and 52 is much smaller than that of the insulator formed through performing electrodeposition processing once at an applied voltage of 15 volts. If electrodeposition processing is performed three times or more, it is possible to further reduce the size of the resin insulator 5 that is capable of achieving desired characteristics of the capacitor 1.

Dry processing as the processing for increasing the electrical resistance of the electro-deposit is performed mainly for the purpose of removing water from the electro-deposit to increase the electrical resistance of the electro-deposit. The dry processing may also promote curing of the electro-deposit. The dry processing may be performed in the air or in a vacuum at a temperature in a range from room temperature (25° C.) to 120° C. inclusive, for example. To attain a higher electrical resistance of the electro-deposit, it is effective to further perform processing for curing the electro-deposit by heating after the dry processing. This curing processing may be performed at a temperature in a range from 150° C. to 300° C. inclusive, for example. The curing processing is preferably performed in a vacuum or in an inert atmosphere to prevent oxidation of the electro-deposit.

In the case of performing electrodeposition processing a plurality of times, it is preferred that the applied voltage be made higher at a later one of the plurality of times than at an earlier one of the plurality of times. In this case, it is preferred that the applied voltage at the first electrodeposition processing be 10% to 50% of the final target applied voltage that is required to ensure a desired withstand voltage of the capacitor 1. If the applied voltage at the first electrodeposition processing is 10% or more of the final target applied voltage, it is possible to form a certain amount of electro-deposit and to thereby increase the electrical resistance of this electro-deposit. If the applied voltage at the first electrodeposition processing is 50% or less of the final target applied voltage, it is possible to prevent formation of an electro-deposit larger than required. The most suitable voltage to be applied at the first electrodeposition processing is appropriately chosen to obtain desired effects. If there exists a relatively large defect 31 in the dielectric layer 3, it is preferred to perform the first electrodeposition processing at a low applied voltage.

To be specific, if the final target applied voltage is 5 volts, the applied voltage at the first electrodeposition processing is preferably around 0.5 to 2 volts, although it greatly depends on the characteristics of the electrodeposition resin and the state of the dielectric layer 3. If the final target applied voltage is 10 volts or higher, in particular, it is preferred to perform electrodeposition processing three times or more. Even when the final target applied voltage is high, it is preferred that the applied voltage at the first electrodeposition processing fall within a range of 1 to 5 volts. For example, if the final target applied voltage is 50 volts, electrodeposition processing is performed three times with an applied voltage of around 2 to 4 volts at the first electrodeposition processing, around 5 to 15 volts at the second electrodeposition processing, and 50 volts at the third electrodeposition processing.

Figure 9:
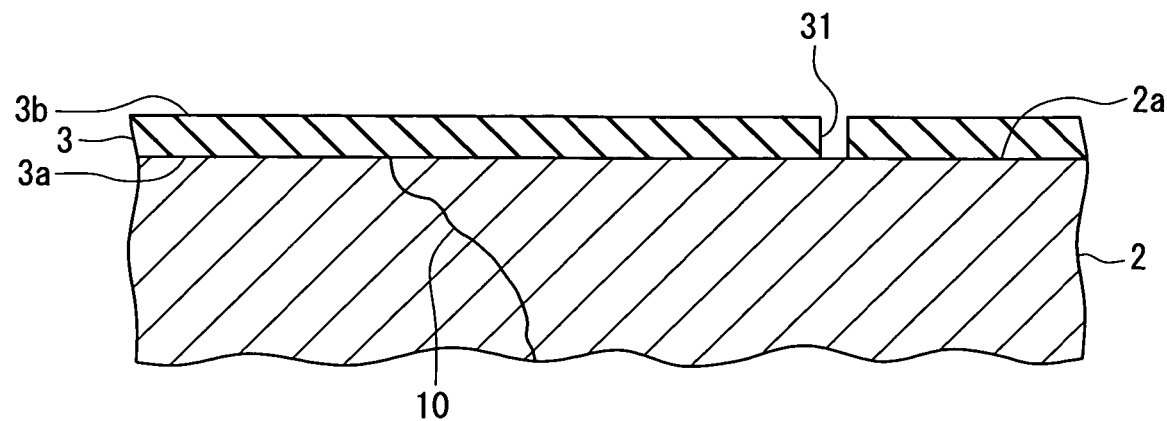
FIG. 9 is a cross-sectional view illustrating a step of the method of manufacturing the capacitor of the second embodiment of the invention.
Figure 10:
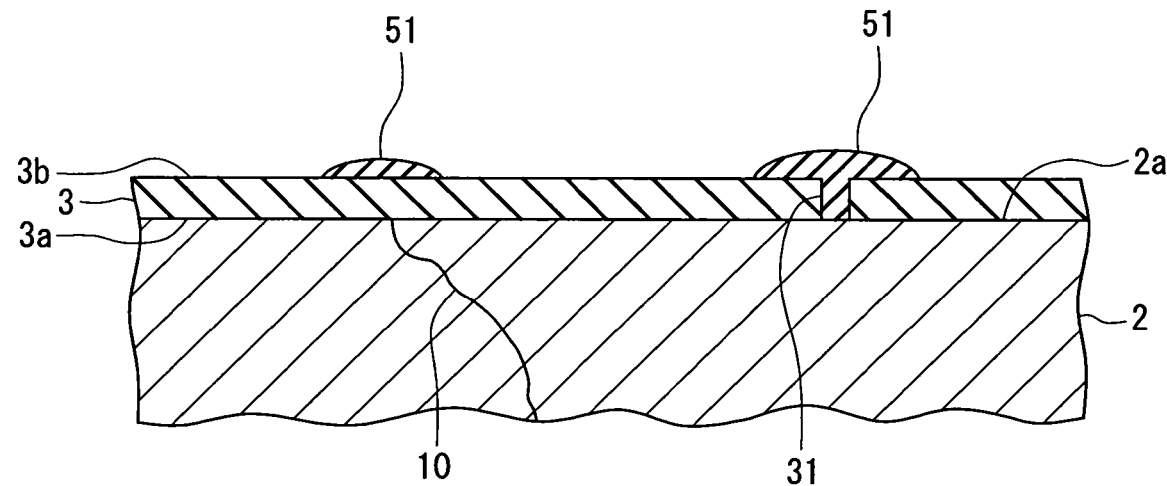
FIG. 10 is a cross-sectional view illustrating a step that follows the step of FIG. 9.
Figure 11:
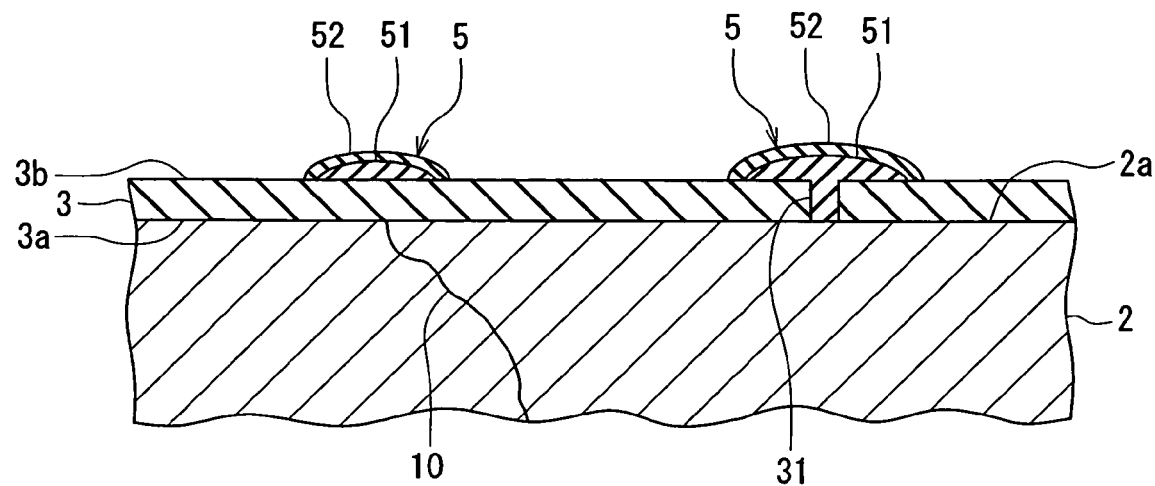
FIG. 11 is a cross-sectional view illustrating a step that follows the step of FIG. 10.

Reference is now made to FIG. 9 to FIG. 11 to specifically describe the method of manufacturing the capacitor 1 of the second embodiment. The following description is based on the premise that the lower electrode 2 is formed of a foil made of a polycrystalline metal. FIG. 9 is a cross-sectional view illustrating a step of the method of manufacturing the capacitor 1 of the second embodiment. In the method, as shown in FIG. 9, the dielectric layer 3 is first formed on the top surface 2a of the lower electrode 2. Before the dielectric layer 3 is formed, the foil used as the lower electrode 2 is preferably subjected to heat treatment at a temperature equal to or higher than the temperature of future heat treatment to be performed after the dielectric layer 3 is formed. Furthermore, it is preferred to perform flattening processing by polishing, for example, on the top surface 2a of the lower electrode 2 before the dielectric layer 3 is formed.

Next, the resin insulator 5 is formed on the top surface 3b of the dielectric layer 3 by electrophoresis. In the second embodiment, in the step of forming the resin insulator 5, a step of forming by electrophoresis an electro-deposit that will be part of the resin insulator 5 later (the step will be hereinafter called the electrodeposition step) and a step of increasing the electrical resistance of the electro-deposit (the step will be hereinafter called the resistance raising step) are alternately repeated twice or more. The details of the step of forming the electro-deposit are the same as those of the electrodeposition step of the first embodiment.

FIG. 10 illustrates the first electrodeposition step and the first resistance raising step. In the first electrodeposition step, as shown in FIG. 10, the electro-deposit 51 is formed on the top surface 3b of the dielectric layer 3. In the example shown in FIG. 10, part of the electro-deposit 51 is formed to repair the defect 31 of the dielectric layer 3 while the other part of the electro-deposit 51 is formed to cover at least part of the grain boundary 10 of the polycrystalline metal appearing at the top surface 2a of the lower electrode 2 when seen from above the top surface 3b of the dielectric layer 3. Next, the first resistance raising step is performed. The first resistance raising step may include a step of drying the electro-deposit 51, or may include a step of drying the electro-deposit 51 and a step of curing the dried electro-deposit 51 by heating.

FIG. 11 illustrates the second electrodeposition step and the second resistance raising step. In the second electrodeposition step, as shown in FIG. 11, the electro-deposit 52 is formed to cover the electro-deposit 51. Next, the second resistance raising step is performed. In the case where an electrodeposition step and a resistance raising step are to be further repeated after the second resistance raising step, the second resistance raising step may include a step of drying the electro-deposit 52, or may include a step of drying the electro-deposit 52 and a step of curing the dried electro-deposit 52 by heating. If the second resistance raising step is the final one, the electro-deposit 52 is dried and then the electro-deposits 51 and 52 are cured by heating in the second resistance raising step.

FIG. 11 illustrates an example in which the electrodeposition step and the resistance raising step are alternately repeated twice to form the resin insulator 5. In this case, as previously described, it is preferred that the applied voltage at the first electrodeposition step be lower than the final target applied voltage required to ensure a desired withstand voltage of the capacitor 1 and that the applied voltage at the second electrodeposition step be the final target applied voltage. In the example of FIG. 11, the resin insulator 5 is formed of the electro-deposits 51 and 52 that have been cured. Alternatively, an electrodeposition step and a resistance raising step may be further repeated alternately after the second resistance raising step. In this case, one or more additional electro-deposits are formed to cover the electro-deposit 52. In this case, furthermore, in the final resistance raising step, the electro-deposit formed last is dried and then all the electro-deposits are cured by heating. The resin insulator 5 is thereby formed of three or more cured electro-deposits.

Next, as shown in FIG. 8, the upper electrode layer 4 is formed by sputtering, for example, on the resin insulator 5 and the top surface 3b of the dielectric layer 3 to complete the capacitor 1.

According to the embodiment as thus described, the electrodeposition step and the resistance raising step are alternately repeated twice or more in the step of forming the resin insulator 5. It is thereby possible to form the resin insulator 5 having a smaller size, compared with a case in which the resin insulator 5 is formed through performing electrodeposition processing once. As a result, the embodiment makes it possible to prevent such problems that a portion of the upper electrode layer 4 located above the insulator 5 greatly protrudes, it becomes difficult to pattern the upper electrode layer 4, and the effective electrode-opposed area of the capacitor 1 is decreased to cause a reduction in capacitance of the capacitor 1. Therefore, according to the embodiment, it is possible to prevent an increase in leakage current of the dielectric layer 3 and an occurrence of short-circuit failure while suppressing degradation of the characteristics of the capacitor 1.

In the second embodiment, if each of the resistance raising steps performed a plurality of times includes the step of drying the electro-deposit and the step of curing the dried electro-deposit by heating, it is possible to prevent an increase in leakage current of the dielectric layer 3 and an occurrence of short-circuit failure with higher reliability.

In the embodiment, if the electrodeposition step and the resistance raising step are alternately repeated three times or more to form the resin insulator 5, it is possible to prevent an increase in leakage current of the dielectric layer 3 and an occurrence of short-circuit failure with higher reliability, compared with a case in which the electrodeposition step and the resistance raising step are alternately repeated twice to form the resin insulator 5.

Examples of the method of manufacturing the capacitor 1 of the embodiment will now be described.

FIRST EXAMPLE

In a first example, the electrodeposition step and the resistance raising step are alternately repeated twice in the step of forming the resin insulator 5. In the first resistance raising step, the electro-deposit 51 is dried. In the second resistance raising step, the electro-deposit 52 is dried and then the electro-deposits 51 and 52 are cured by heating.

In the first example, first, an electrolytic nickel foil having a thickness of 30 μm was subjected to heat treatment at a temperature of 1000° C. in a nitrogen atmosphere, and then buffing was performed to flatten the surface. This nickel foil was used as the lower electrode 2. As a result of analyzing the content of impurities listed in the table 1 on the electrolytic nickel foil used as the lower electrode 2, the total impurities content was 310 ppm. Next, the dielectric layer 3 made of barium titanate having a thickness of 200 nm was formed by MOD on the top surface 2a of the lower electrode 2. To be specific, a process of forming a single MOD layer approximately 50 nm in thickness by spray coating and subjecting the MOD layer to heat treatment on a hot plate at a temperature of 400° C. in the air was repeated four times, and then rapid heat treatment was performed at a temperature of 900° C. in a reducing atmosphere to thereby form the dielectric layer 3 having a high permittivity. The dielectric layer 3 had the defect 31.

Next, the first electrodeposition step was performed using a polyimide-base anion electrodeposition resin as the electrodeposition resin to form the electro-deposit 51 on the top surface 3b of the dielectric layer 3. In the first electrodeposition step, the applied voltage was gradually increased from 0 to 3 volts over five minutes.

Next, the layered structure including the lower electrode 2 and the dielectric layer 3 was retrieved from the electrodeposition solution and cleaned with ultra pure water. Then, as the first resistance raising step, dry processing was performed at a temperature of 100° C. in the air for ten minutes to dry the electro-deposit 51.

Next, the second electrodeposition step was performed using the electrodeposition resin the same as that of the first electrodeposition step to form the electro-deposit 52 to cover the electro-deposit 51. In the second electrodeposition step, the applied voltage was gradually increased from 2 to 15 volts over five minutes.

Next, the layered structure was retrieved from the electrodeposition solution and cleaned with ultra pure water. Then, as the second resistance raising step, dry processing was performed at a temperature of 100° C. in the air for ten minutes and thermosetting processing was then performed at a temperature of 250° C. in a vacuum for one hour to cure the electro-deposits 51 and 52 to thereby form the resin insulator 5. The maximum height of the resin insulator 5 was 2.6 μm.

Next, a first copper layer having a thickness of 1 μm was formed by sputtering on the resin insulator 5 and the top surface 3b of the dielectric layer 3, and then a second copper layer having a thickness of 29 μm was formed by electroplating on the first copper layer. The upper electrode layer 4 made up of the first and second copper layers and having a thickness of 30 μm was thus formed to complete the capacitor 1.

In the capacitor 1 manufactured through the first example, the electrode-opposed area was 200 mm$^2$, the leakage current was $6\times10^{-7}$ A/cm$^2$, the short-circuit rate was 4%, and the capacitance was 4.0 μF.

A reference capacitor was manufactured through a reference manufacturing method wherein the step of forming the resin insulator 5 was only different from the first example of the embodiment. In the step of forming the resin insulator 5 of the reference method, an electro-deposit was formed through electrodeposition step performed once. In this electrodeposition step, the applied voltage was gradually increased from 0 to 15 volts over ten minutes. Next, the electro-deposit was cured to form the resin insulator 5 through a process the same as the second resistance raising step of the first example. The remainder of conditions for the reference method were the same as those of the first example.

In the reference capacitor, the maximum height of the resin insulator 5 was 15 μm, the electrode-opposed area was 200 mm$^2$, the leakage current was $6\times10^{-7}$ A/cm$^2$, the short-circuit rate was 15%, and the capacitance was 3.2 μF. The reference capacitor had a much greater maximum height, a higher short-circuit rate, and a smaller capacitance, compared with the capacitor 1 manufactured through the first example. As a result of observing some of the short-circuited portions of the reference capacitor with a microscope, there were traces of flaking-off of the resin insulator 5.

The foregoing results indicate that, according to the first example of the embodiment, it is possible to greatly reduce the maximum height of the resin insulator 5, to reduce the short-circuit rate, and to increase the capacitance, compared with the reference capacitor.

SECOND EXAMPLE

In a second example, the electrodeposition step and the resistance raising step are alternately repeated twice in the step of forming the resin insulator 5. In the first resistance raising step, the electro-deposit 51 is dried and then cured by heating. In the second resistance raising step, the electro-deposit 52 is dried and then cured by heating.

In the second example, the first resistance raising step is only different from that of the first example. In the first resistance raising step of the second example, dry processing was performed at a temperature of 100° C. in the air for ten minutes to dry the electro-deposit 51, and then thermosetting processing was performed at a temperature of 250° C. in a vacuum for one hour to cure the electro-deposit 51. The maximum height of the electro-deposit 51 cured was 2.3 μm. In the capacitor 1 manufactured through the second example, the maximum height of the resin insulator 5 was 2.6 μm, the electrode-opposed area was 200 mm$^2$, the leakage current was $6\times10^{-7}$ A/cm$^2$, the short-circuit rate was 1%, and the capacitance was 4.1 μF. As thus described, the capacitor 1 manufactured through the second example had a lower short-circuit rate and a slightly larger capacitance, compared with the capacitor 1 manufactured through the first example.

THIRD EXAMPLE

In a third example, the electrodeposition step and the resistance raising step are alternately repeated three times in the step of forming the resin insulator 5. In the first resistance raising step, an electro-deposit formed in the first electrodeposition step is dried. In the second resistance raising step, an electro-deposit formed in the second electrodeposition step is dried. In the third resistance raising step, an electro-deposit formed in the third electrodeposition step is dried and then all the electro-deposits are cured by heating.

The third example is different from the first example only in the step of forming the resin insulator 5. In the step of forming the resin insulator 5 of the third example, first, the first electrodeposition step was performed using a polyimide-base anion electrodeposition resin as the electrodeposition resin to form a first electro-deposit on the top surface 3b of the dielectric layer 3. In the first electrodeposition step, the applied voltage was gradually increased from 0 to 2 volts over five minutes.

Next, the layered structure including the lower electrode 2 and the dielectric layer 3 was retrieved from the electrodeposition solution and cleaned with ultra pure water. Then, as the first resistance raising step, dry processing was performed at a temperature of 100° C. in the air for ten minutes to dry the first electro-deposit.

Next, the second electrodeposition step was performed using the electrodeposition resin the same as that of the first electrodeposition step to form a second electro-deposit to cover the first electro-deposit. In the second electrodeposition step, the applied voltage was gradually increased from 1 to 5 volts over five minutes.

Next, the layered structure was retrieved from the electrodeposition solution and cleaned with ultra pure water. Then, as the second resistance raising step, dry processing was performed at a temperature of 100° C. in the air for ten minutes to dry the second electro-deposit.

Next, the third electrodeposition step was performed using the electrodeposition resin the same as that of the first electrodeposition step to form a third electro-deposit to cover the second electro-deposit. In the third electrodeposition step, the applied voltage was gradually increased from 4 to 15 volts over five minutes.

Next, the layered structure was retrieved from the electrodeposition solution and cleaned with ultra pure water. Then, as the third resistance raising step, dry processing was performed at a temperature of 100° C. in the air for ten minutes and thermosetting processing was then performed at a temperature of 250° C. in a vacuum for one hour to cure the first to third electro-deposits to thereby form the resin insulator 5.

In the capacitor 1 manufactured through the third example, the maximum height of the resin insulator 5 was 1.1 μm, the electrode-opposed area was 200 mm$^2$, the leakage current was $4 \times 10^{-7}$ A/cm$^2$, the short-circuit rate was 0%, and the capacitance was 4.2 μF. As thus described, the capacitor 1 manufactured through the third example had a smaller leakage current, a lower short-circuit rate and a slightly larger capacitance, compared with the capacitor 1 manufactured through the first example.

The remainder of configuration, function and effects of the second embodiment are similar to those of the first embodiment.

The present invention is not limited to the foregoing embodiments but may be practiced in still other ways. For example, the capacitor of the invention may have a configuration in which a total of two or more additional dielectric and electrode layers are alternately stacked on the top surface 4b of the upper electrode layer 4. As a result, it is possible to form a capacitor having a configuration in which electrode layers and dielectric layers are alternately stacked in a total of five or more layers. In this case, after each dielectric layer is formed, the resin insulator 5 is formed before each electrode layer is formed on the dielectric layer.

The capacitor of the invention may be a discrete element or part of a device including elements other than the capacitor.

For example, the capacitor of the invention may be incorporated in a high-density mounting board through the use of a known method of manufacturing a build-up wiring board. The high-density mounting board incorporating the capacitor of the invention may be used as an interposer disposed between a CPU and a motherboard, or a package board.

Figure 16:
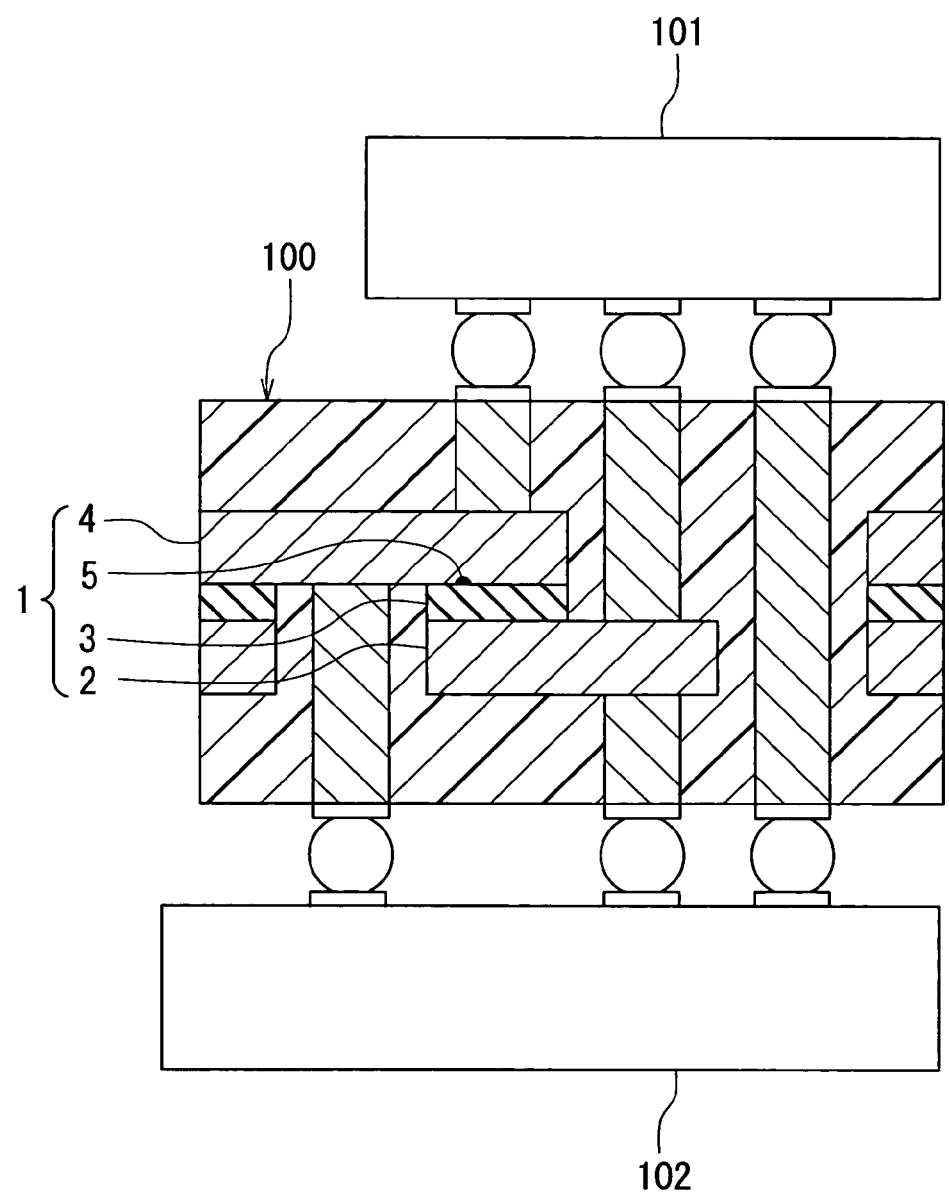
FIG. 16 is a cross-sectional view illustrating an example of a high-density mounting board incorporating the capacitor of the invention.

FIG. 16 illustrates an overall configuration of an interposer 100 disposed between a CPU 101 and a motherboard 102 as an example of high-density mounting board incorporating the capacitor 1 of the invention. The interposer 100 incorporates the lower electrode 2, the dielectric layer 3, the upper electrode layer 4, and the resin insulator 5 that make up the capacitor 1 of the invention.

Obviously many modifications and variations of the present invention are possible in the light of the above teachings. It is therefore to be understood that within the scope of the appended claims the invention may be practiced otherwise than as specifically described.

What is claimed is:

1. A capacitor comprising: a lower electrode formed of a foil made of a polycrystalline metal; an upper electrode layer; and a dielectric layer disposed between the lower electrode and the upper electrode layer, wherein:
    the lower electrode has a top surface facing the dielectric layer, and has grain boundaries of the polycrystalline metal appearing at the top surface;
    the upper electrode layer has a bottom surface facing the dielectric layer; and
    the dielectric layer has a bottom surface facing the top surface of the lower electrode, and a top surface facing the bottom surface of the upper electrode layer,
    the capacitor further comprising a resin insulator that is disposed between the top surface of the dielectric layer and the bottom surface of the upper electrode layer and that is present only in part of a region in which the top surface of the dielectric layer and the bottom surface of the upper electrode layer face each other, wherein
    the resin insulator is disposed to cover at least part of the grain boundaries appearing at the top surface of the lower electrode when seen from above the top surface of the dielectric layer.

2. The capacitor according to claim 1, wherein the polycrystalline metal contains impurities, and exhibits grain boundary segregation wherein a concentration of the impurities is higher at the grain boundaries than in crystal grains.

3. The capacitor according to claim 2, wherein the polycrystalline metal has an impurities content of 30 to 6000 ppm inclusive.

4. A method of manufacturing a capacitor comprising a lower electrode formed of a foil made of a polycrystalline metal, an upper electrode layer, and a dielectric layer disposed between the lower electrode and the upper electrode layer, wherein:
    the lower electrode has a top surface facing the dielectric layer, and has grain boundaries of the polycrystalline metal appearing at the top surface;
    the upper electrode layer has a bottom surface facing the dielectric layer; and
    the dielectric layer has a bottom surface facing the top surface of the lower electrode, and a top surface facing the bottom surface of the upper electrode layer,
    the capacitor further comprising a resin insulator that is disposed between the top surface of the dielectric layer and the bottom surface of the upper electrode layer and that is present only in part of a region in which the top surface of the dielectric layer and the bottom surface of the upper electrode layer face each other, wherein the resin insulator is disposed to cover at least part of the grain boundaries appearing at the top surface of the lower electrode when seen from above the top surface of the dielectric layer, the method comprising the steps of:

forming the dielectric layer on the top surface of the lower electrode;

forming the resin insulator on the top surface of the dielectric layer by electrophoresis; and forming the upper electrode layer.

5. The method according to claim 4, wherein the polycrystalline metal contains impurities, and exhibits grain boundary segregation wherein a concentration of the impurities is higher at the grain boundaries than in crystal grains.

6. The method according to claim 5, wherein the polycrystalline metal has an impurities content of 30 to 6000 ppm inclusive.

7. The method according to claim 4, wherein, in the step of forming the resin insulator, a step of forming by electrophoresis an electro-deposit that will be part of the resin insulator later and a step of increasing an electrical resistance of the electro-deposit are alternately repeated a plurality of times.

8. The method according to claim 7, wherein the step of increasing the electrical resistance of the electro-deposit includes a step of drying the electro-deposit.

9. The method according to claim 7, wherein the step of increasing the electrical resistance of the electro-deposit includes a step of drying the electro-deposit and a step of curing the dried electro-deposit by heating.

10. The method according to claim 7, wherein, when the step of forming the electro-deposit is repeated a plurality of times, a voltage applied for electrophoresis is made higher at a later one of the plurality of times than at an earlier one of the plurality of times.

* * * * *